United States Patent [19]
Douglas et al.

[11] Patent Number: 5,596,587
[45] Date of Patent: Jan. 21, 1997

[54] METHOD AND APPARATUS FOR PREPARING IN-CIRCUIT TEST VECTORS

[75] Inventors: Raymond W. Douglas, Orinda, Calif.; Philip J. Stinger, Otter Shaw, England; Harold W. Ng, Concord; Terence N. Lee, Oakland, both of Calif.

[73] Assignee: Teradyne, Inc., Boston, Mass.

[21] Appl. No.: 39,947

[22] Filed: Mar. 29, 1993

[51] Int. Cl.$^6$ ............................................. G01R 31/28
[52] U.S. Cl. ............................................. 371/27; 364/579
[58] Field of Search ............................ 364/578, 579, 364/488, 489, 490; 371/27, 23, 25; 324/73.1, 158 R

[56] References Cited

U.S. PATENT DOCUMENTS

| | | | |
|---|---|---|---|
| 4,066,882 | 1/1978 | Esposito | 324/73.1 |
| 4,176,780 | 12/1979 | Sacher et al. | 371/27 |
| 4,433,414 | 2/1984 | Carey | 371/27 |
| 4,534,028 | 8/1985 | Trischler | 324/73.1 |
| 4,556,840 | 12/1985 | Russell | 324/73.1 |
| 4,646,299 | 2/1987 | Schinabeck | 364/579 |
| 4,672,307 | 6/1987 | Breuer | 371/27 |
| 4,688,223 | 8/1987 | Motika et al. | 371/27 |
| 4,907,230 | 3/1990 | Heller et al. | 371/22.1 |
| 5,004,978 | 4/1991 | Morris, Jr. et al. | 324/158 R |
| 5,111,459 | 5/1992 | DeVigne | 371/27 |
| 5,258,986 | 11/1993 | Zerbe | 371/27 |
| 5,297,151 | 3/1994 | Gruetzner et al. | 371/27 |

OTHER PUBLICATIONS

Saab et al., "CRIS: A Test Cultivation Program for Sequential VLSI Circuits," 1992 IEEE/ACM International Conference on Computer-Aided Design, Santa Clara, CA, pp. 216–219.
Giraldi & Bushnell, "EST: The New Frontier in Automatic Test–Pattern Generation," *IEEE*, 667–672, 1990.
Manual History, "Z1800–Series Programmer's Guidebook," *Special and Advanced Applications*, 7–35–7–73, 1992.
Wirbel, "Startup claims ASIC test coup," *Electronic Engineering Times*, Issue 588, Apr. 30, 1990.
Cosley, "Strategies and tools for generating test vectors differ for design and production test," *Personal Engineering & Instrumentation News*, 53–58, Aug. 1990.
Jack Shandle, "Testing ICs to the Max," *Electronics*, 39–40, May 1990.
M. D. Durand, "Accuracy vs. Speed in Placement," *IEEE Design & Test of Computers*, 8–34, Jun. 1989.
Saluja and Kim, "Improved Test Generation for High–Activity Circuits", *IEEE Design & Test of Computers*, 26–31, Aug. 1990.
Bassett, et al., "Low–Cost Testing of High–Density Logic Components", *IEEE Design & Test of Computers*, 15–28, Apr. 1990.

(List continued on next page.)

*Primary Examiner*—Ellis B. Ramirez
*Attorney, Agent, or Firm*—Arnold, White & Durkee

[57] ABSTRACT

Method and apparatus for preparing sequences of test vectors to test for proper assembly of complex custom IC's onto printed circuit boards. The method, operating with appropriate apparatus for driving and sensing pins of a sample IC, automatically prepares an in-circuit test vector sequence, starting with only rudimentary information about the pins of the IC and no information at all about the functions or internal structure of the IC. The method makes use of goal-seeking and minimization procedures. The goal-seeking procedure constructs vector sequences from pseudorandom numbers until it finds a sequence which effectively and stably attains a set of pin fault coverage goals stated by the human operator. The minimization procedure then shortens the sequence, discarding excess vectors and keeping only those which efficiently contribute to the attainment of the pin fault coverage goal. The human operator may suggest sets of goals and starting sets of vectors, and may define clock events and data exchange cycles of multiple vectors in order to give the process a head start. The vectors are translated into a form suitable for incorporation into the programs of popular in-circuit ATE.

16 Claims, 28 Drawing Sheets

OTHER PUBLICATIONS

Abramovici, et al., "Digital Systems Testing and Testable Design", *Computer Science Press*, 181–342.

Chen, et al., "Checkpoints in Irredundant Two–Level Combinational Circuits", *Journal of Electronic Testing: Theory and Applications*, 2:395–397, 1991.

Chatterjee and Abraham, "Test Generation, Design–for–Testability and Built–In Self–Test for Arithmetic Units Based on Graph Labeling", *Journal of Electronic Testing: Theory and Applications*, 2:351–372, 1991.

Markowsky, "Bounding Fault Detection Probabilities in Combinational Circuits", *Journal of Electronic Testing, Theory and Applications*, 2:315–323, 1991.

Reppen and Aas, "Combined Probabilistic Testability Calculation and Compact Test Generation for PLAs", *Journal of Electronic Testing: Theory and Applications*, 2:215–227, 1991.

Giraldi and Bushnell, "Search State Equivalence for Redundancy Identification and Test Generation," *IEEE*, International Test Conference 1991.

FIG. 2

```
         init
70 ─────┐    (
         h(/ior /iow) ─────────────── 71
         h(reset)
         l(reset) ──────────────────── 72
         h(IRQ2)

w($23c 0) ─────────────────── 73
% write to teach reg.
         w($23d 0)
         w($23e 0)

R($3E3E) ──────────────────── 74
         W($A201 $1431)
         R($D23D)
         R($8E3C)
         R($2201)
         )                              ─── 75
goal   (
  find  (
         state( z(d[0-7])   )
         state( h(/gamew /gamer))   )
         ( outputs
         )
    stim    ( inputs cycles !reset
)
         )
```

FIG. 17a

```
'1800VP test template for: T4
'Date: 1/15/1993
'Produced by SafeCracker V1.0

NPINS = 39;
10,     D0,      IO;
7,      D1,      IO;
4,      D2,      IO;
28,     D3,      IO;
2,      D4,      IO;
5,      D5,      IO;
8,      D6,      IO;
11,     D7,      IO;
55,     IRQOUT,  O;
53,     DIR,     O;
26,     /GAMER,  O;
29,     /GAMEW,  O;
13,     RESET,   I;
16,     A0,      I;
19,     A1,      I;
22,     A2,      I;
25,     A3,      I;
40,     A4,      I;
31,     A5,      I;
34,     A6,      I;
37,     A7,      I;
71,     A8,      I;
43,     A9,      I;
46,     AEN,     I;
49,     /IOR,    I;
52,     /IOW,    I;
50,     YDB,     I;
47,     YDA,     I;
44,     XDB,     I;
41,     XDA,     I;
32,     IRQ2,    I;
56,     IRQ3,    I;
38,     IRQ4,    I;
64,     IRQ5,    I;
23,     LB,      I;
20,     MB,      I;
17,     RB,      I;
14,     OSC,     I;
35,     VSS,     U;
```

```
VECTOR;    ' Initialization
    begin set;
XXXXXXXXXXXXLLLLLLLLLLLLLLLLLLLLLLLZ;'P:0
XXXXXXXXXXXXLLLLLLLLLLLHHLLLLLLLLLLLZ;'P:1
XXXXXXXXXXXXHLLLLLLLLLLHHLLLLLLLLLLLZ;'P:2
XXXXXXXXXXXXLLLLLLLLLLLHHLLLLLLLLLLLZ;'P:3
XXXXXXXXXXXXLLLLLLLLLLLHHLLLLHLLLLLLZ;'P:4
XXXXXXXXXXXXLLLHHHHLLLHLHHLLLLHLLLLLLZ;'P:5    W
LLLLLLLLXXXXLLLHHHHLLLHLHHLLLLHLLLLLLZ;'P:6
LLLLLLLLXXXXLLLHHHHLLLHLHLLLLLHLLLLLLZ;'P:7
LLLLLLLLXXXXLLLHHHHLLLHLHHLLLLHLLLLLLZ;'P:8
XXXXXXXXXXXXLLLHHHHLLLHLHHLLLLHLLLLLLZ;'P:9
XXXXXXXXXXXXLHLHHHHLLLHLHHLLLLHLLLLLLZ;'P:10   W
    .
    .
    .
XXXXXXXXXXXXLLLHHHHLLLHLHLHLLLLHLLLLLLZ;'P:32
XXXXXXXXXXXXLLLHHHHLLLHLHHLLLLHLLLLLLZ;'P:33
XXXXXXXXXXXXLHLLLLLLLHLHHLLLLHLLLLLLZ;'P:34   R
XXXXXXXXXXXXLHLLLLLLLHLHLLLLLHLLLLLLZ;'P:35
XXXXXXXXXXXXLHLLLLLLLHLHHLLLLHLLLLLLZ;'P:36
```

FIG. 18b

```
                                    79
                                     ↓            81
                                                  |
                                                  ↓
    ' Test body
UUUUUUUUUUUUULHLLLLLLLLHLHHLLLLHLLLLLLZ;'P:37
UUUUUUUUUUUUULHLLLLLLLLHLHHLLLLHLLLLLLHZ;'P:38
UUUUUUUUUUUUULHLHHHHLLLHLHHLLLLHLLLLLLHZ;'P:39    R
UUUUUUUUUUUUULHLHHHHLLLHLLHLLLLHLLLLLLHZ;'P:40
UUUUUUUUUUUUULHLHHHHLLLHLHHLLLLHLLLLLLHZ;'P:41
UUUUUUUUUUUUULHLLLLLLLHLHHLLLLHLLLLLLHZ;'P:42    W
HHHHHHHHUUUUULHLLLLLLLLHLHHLLLLHLLLLLLHZ;'P:43
HHHHHHHHUUUUULHLLLLLLLLHLHLLLLLHLLLLLLHZ;'P:44

.
    .
    .

UUUUUUUUUUUUULLLHHHHLLLHLHHHHLHLHHLHHHHZ;'P:282
UUUUUUUUUUUUUHLLHHHHLLLHLHHHHLHLHHLHHHHZ;'P:283
UUUUUUUUUUUUUHLLHHHHLLLHLHHHHLHLHHLHHHHZ;'P:284  R
UUUUUUUUUUUUUHLLHHHHLLLHLLHHHHLHLHHLHHHHZ;'P:285
UUUUUUUUUUUUUHLLHHHHLLLHLHHHHLHLHHLHHHHZ;'P:286
    end set;
end VECTOR;
```

|
                                                  82

FIG. 18c

125 — test
(
L(D2)
H(CK) — 140
L(CK)
H(/LD)
H(CK)
L(/LD)
L(CK)
H(D1)
H(CK)
L(CK)
H(D3)
L(CK)
H(/LD)
L(CK)
H(/CET)
H(CK)
L(D0)
L(/LD)
p(2,CK) — 139
H(D2)
p(2,CK)
L(CK)
H(D0)
L(/CET)
H(UD)
H(CK)
L(CK)
H(/CEP)
H(/LD)
H(CK)
)

126 — goal(
find( all )
stim( inputs )
)

FIG. 20b

```
'1800VP test template for:
1692
NPINS = 14;
14,      Q0,      O;
13,      Q1,      O;
12,      Q2,      O;
11,      Q3,      O;
15,      /TC,     O;
2,       CK,      I;
1,       UD,      I;
3,       D0,      I;
4,       D1,      I;
5,       D2,      I;
6,       D3,      I;
7,       /CEP,    I;
10,      /CET,    I;
9,       /LD,     I;
VECTOR;                 '
Initialisation
         begin set;
XXXXXZZZZZZZZZ;'P:0
XXXXXLLLLLLLL;'P:1
XXXXXLLHLLLLL;'P:2
XXXXXLLHLHLLL;'P:3
XXXXXHLHLHLLL;'P:4
XXXXXLLHLHLLL;'P:5
```

FIG. 21a

```
' Test body
UDUDULLHLHLLLL;'P:6
UDUDULLHLLLLLL;'P:7
UDDDUHLHLLLLLL;'P:8
UDDDULLHLLLLLL;'P:9
UDDDULLHLLLLLH;'P:10
DDDDDHLHLLLLLH;'P:11
DDDDDHLHLLLLLL;'P:12
DDDDDLLHLLLLLL;'P:13
DDDDDLLHHLLLLL;'P:14
UUDDUHLHHLLLLL;'P:15
UUDDULLHHLLLLL;'P:16
UUDDULLHHLHLLL;'P:17
UUDUUHLHHLHLLL;'P:18
UUDUUHLHHLHLLH;'P:19
UUDUULLHHLHLLH;'P:20
UUDUULLHHLHLHH;'P:21
UUDUUHLHHLHLHH;'P:22
UUDUUHLLHLHLHH;'P:23
UUDUUHLLHLHLHL;'P:24
UUDUULLLHLHLHL;'P:25
DUDUUHLLHLHLHL;'P:26
DUDUUHLLHHHLHL;'P:27
DUDUULLLHHHLHL;'P:28
DUUUUHLLHHHLHL;'P:29
DUUUULLLHHHLHL;'P:30
DUUUULLHHHHLHL;'P:31
DUUUULLHHHHLLL;'P:32
DUUUULHHHHHLLL;'P:33
UUUUDHHHHHHLLL;'P:34
UUUUDLHHHHHLLL;'P:35
UUUUDLHHHHHHLL;'P:36
UUUUDLHHHHHHLH;'P:37
UUUUDHHHHHHHLH;'P:38
    end set;
end VECTOR;
```

METHOD AND APPARATUS FOR PREPARING IN-CIRCUIT TEST VECTORS

The invention relates to test vector generation for digital in circuit tests

Automatic test equipment (ATE) is used to inspect assembled printed circuit boards (PCB's). In particular, "in-circuit" ATE is used for detecting and reporting faults on newly assembled PCB's in the production line. A test program including a series of test steps controls the actions of the ATE, telling it how to test the PCB and how to report faults. A typical in-circuit test program inspects the PCB to verify correct assembly, i.e. the program is designed to confirm that each part is the correct part and that all of its pins are properly connected to the printed wiring. In the ideal case, each test step in the test program is devoted to the inspection of one component.

Each test step stimulates, and evaluates responses from, a named component associated with the test step. If the test produces an out-of-limit analog response or an unexpected digital response, the tester rejects the PCB and reports the named component associated with the test step. A rework operator thus guided can easily repair the board and return it to the tester for retest. An information system may collect failure information over a period of time and supply statistics to a quality improvement process.

An in-circuit test step for a complex digital integrated circuit (IC) on a printed circuit board specifies a connected sequence of digital test vectors, one vector following the next in a defined and repeatable sequence. Each digital test vector in the sequence specifies, for a given instant in time, the stimulus signals the tester is to apply to input pins of the IC, and in addition the response signals that the tester is to expect from a good IC that is correctly installed in the PCB.

A valid sequence of digital test vectors for a particular named component must be stable and must comprehensively cover static faults on IC pins. "Stable" means that when the tester applies this sequence to a PCB that is correctly assembled from good parts, the tester will never mistakenly reject the board and report its associated named component. "Comprehensively" means that when the tester applies the sequence to a PCB on which the associated named component is incorrect, is missing, is nonfunctional, or has one or more unsoldered pins, the tester will reject the PCB and report the named component. "Static" means that the fault being detected persists throughout the test vector sequence: for example, an open input pin would deliver a constant level to the IC under test, rather than allow the pin to deliver the bits from the stimulus part of the vector; an open output pin would deliver a constant level to the tester, rather than conduct the actual highs and lows that emanate from the stimulated IC.

Because the test vector sequence is oriented toward finding static faults associated with pins of an IC in a PCB under test, it may be said that it covers static pin faults, or often just "pin faults."

The requirements for stability and comprehensiveness, though simpler by far than requirements for a complete test of an IC's internal semiconductor structure, are still far from trivial. Many situations can lead to instability: to name a few, failure to initialize a sequential IC; failure to account for slow response of the IC or of the tester; failure to provide vectors at a rate sufficient to keep a dynamic IC such as a dynamic RAM alive; and failure of a stimulus sequence to guarantee the outcome of logic hazards internal to the IC.

Many situations also interfere with proper analysis of the comprehensiveness of the pin fault coverage of the vector sequence. It is time consuming to verify pin fault coverage, especially coverage of an IC's input pins because the tester cannot directly observe static faults on input pins as it can with static faults on output pins, and because the programmer is often at a loss as to how to modify the vector sequence to improve input-pin coverage, so the programmer may shirk the coverage analysis.

Preparation of stable, comprehensive in-circuit test vector sequences for complex IC's is costly, requiring expensive capital equipment and large quantities of highly skilled human labor.

The problem is getting worse, not better, as time goes on. Recent advances in the art of designing and implementing complex custom IC's have amplified the problem by increasing the number of complex custom IC's built into new PCB designs. Today, a PCB designer can work with an IC foundry to create a fully custom chip or semicustom gate array chip, or instead select from a wealth of field-customizable technologies including PAL (Programmable Array Logic), GAL (Generic Array Logic), or FPGA (Field Programmable Gate Array) depending on cost and speed tradeoffs. PCB's containing these devices must be tested, so test vectors must be prepared for them.

Any given kind of custom IC tends to appear in only one type of PCB, and it is rare that these expensive test vector sequences developed for one PCB's custom IC's can be re-used on another PCB test program.

A vector sequence for in-circuit testing of a particular kind of IC is generally regarded as fully comprehensive if can detect every open pin on the IC. The comprehensiveness of a test vector sequence is often expressed in terms of pin fault coverage, i.e. if a vector sequence is capable of revealing open conditions on 78 pins of a 100 pin IC, the coverage is 78 per cent. Pin fault coverage is therefore a valuable figure of merit for an in-circuit test vector sequence. Pin fault coverage is fairly easily measured, and is also appropriate to the in-circuit ATE's main job—pointing out faults introduced by the manufacturing process.

For one thing, the "open pin" fault is a frequently encountered kind of PCB assembly fault. Detection of open pins is therefore an essential task of the in-circuit tester. A test that does not detect any open pins is most emphatically not comprehensive.

For another, each IC and the vector sequence that tests its pin faults combine to form a highly tailored and unique mated pair. A vector sequence that accepts one kind of IC is extremely unlikely to accept an IC of a different type. A vector sequence that can report open pins on a particular kind of IC will therefore also indict a good but misoriented IC, or a broken IC, a missing IC or a completely wrong IC.

Evaluating pin fault coverage of a vector sequence typically begins with loading the vector sequence into an ATE and mounting a sample IC in a fixture on the ATE. Pin coverage is evaluated by running the vector sequence repeatedly against the sample IC, while one at a time disconnecting single pins. As each pin is disconnected, the programmer verifies that the test rejects, but then passes again when the pin is reconnected. This process is called "fault injection."

Fault injection, if performed manually, is slow, tedious and error prone. Most machines that perform testing using test vector sequences are provided with features for performing fault injection automatically, and therefore relieve the human operator of this burden.

In automatic fault injection, the ATE repeatedly runs the vector sequence, while automatically one by one perturbing the stimulus signals on the sample IC's input pins. Thus, during any given run, one of the inputs of the sample IC is driven with a constant high or constant low signal instead of with the signal called for in the test vector sequence. In effect, a simulated static fault is automatically injected. The sample IC then behaves as though the input pin had an associated static fault that caused it to stick either high or low, according to the specific current perturbation. Preferably, at least one output pin will change its behavior as a result of the injection of the input fault. If not, the test vector sequence is not capable of reporting this particular input fault.

If at least one output pin changes its behavior as a result of the stimulus perturbation, then the vector sequence can be counted upon to detect and report a static fault associated with the input pin whose stimulus is currently perturbed. The test vector sequence is then said to be capable of "propagating a fault" from an input pin to an output pin. To be considered fully effective, a test vector sequence must reject if an input signal is perturbed to a state of constant high or constant low, but pass if the input signal is unperturbed and applied as called for in the normal test vector sequence.

For output pins, there is a shortcut to fault injection for proving coverage. If the vector sequence drives an output pin to at least two different states during the sequence, the sequence will reliably detect a static fault condition on that output pin. There is no need to perturb the test vector sequence to find out whether or not this condition exists. The condition may be detected automatically by simple inspection of the expected states of the output pins, or by simple measurement of the pins of a sample IC during the running of the unperturbed stimulus part of the test vector sequence.

Conventionally, in-circuit test vector sequences for complex IC's are prepared by one of three methods: trying to adapt the "complete device test" which was used by the IC manufacturer to test individual IC's on a bare-IC ATE; "re-simulating" the IC using a logic simulator and an accurate logic model of the IC, and simple "hand coding" using the in-circuit ATE and a known good sample IC.

All three of these known methods have significant disadvantages, which result in lengthy timescales or in decreased test effectiveness.

The "complete" test sequence can rarely be used on an in-circuit ATE. It is designed to verify faults throughout the internal semiconductor structure, not just to check static faults on the IC's pins, so it will have a great many vectors that are superfluous to the needs of an in-circuit ATE. In addition, the "complete" test vector sequence will often call upon special functions or services (such as precise edge placement) that are present in the bare-IC ATE but which the less expensive in-circuit ATE doesn't need and cannot provide. A third flaw with this approach is that the "complete" test expects to be able to stimulate all of the IC's input pins independently. Once the IC is soldered into the PCB, however, some of these pins may be soldered to other pins, or to fixed voltage sources, constraining them from being stimulated in the way prescribed by the "complete" test vector sequence.

"Re-simulating" is also a rarely used option. In most manufacturing companies, the engineer preparing an in-circuit test program cannot obtain access to the necessary logic simulator and logic model of the IC in question. Typically also, the in-circuit test engineer is not trained in the operation of a logic simulator. Poor linkage software makes it hard to transfer the vectors thus developed from the simulator to the ATE.

"Hand coding," in which the test engineer experiments using a sample IC mounted in a fixture on the actual in-circuit ATE, is the most commonly used method. Unfortunately, it also has drawbacks. Because test vectors are painstakingly composed by hand, times of several days or weeks may be consumed on a typical IC. The in-circuit ATE is used to edit and test the vector sequences, tying up a valuable capital asset whose primary mission is in producing PCB's. And because it is a human process, its results are susceptible to human failings of incompleteness and outright error.

In writing sequences of in-circuit test vectors for an IC, the test programmer will first study the IC and the surrounding circuitry, and then proceed using a trial and error process. Although the formal objectives of stability and comprehensiveness of pin fault coverage still apply, the programmer may find it easier and more gratifying to write vector sequences that exercise identified "functions" of the IC than to write vector sequences that satisfy "goals" of the IC's pins. For example, if the chip is a processor of some sort and the programmer has a databook describing it, the programmer may write a sequence of vectors to supply instructions to it. The resulting test vector sequence, aimed at IC functions rather than at IC pin static faults, may or may not exhibit good pin fault coverage. It will most likely be longer than necessary. In composing it, the human programmer will have had to take the time and trouble to really understand the way the IC works. If the programmer is experienced, and the IC is not pathologically complex, the results will be stable and the coverage reasonably comprehensive, despite the job having cost a great deal to accomplish.

The hand-code method is the one most used, but in fact it is not a very efficient method. For a complex custom IC, it is rare for a programmer to receive a databook, a listing of available instructions, a timing diagram, table of internal microcode, etc. The programmer often receives no defining information at all for a complex custom IC. After looking at the schematic diagram for the PCB on which the IC is found, the programmer may be able to make intelligent deductions as to which pins are inputs, which are outputs and which are bidirectional. Of the inputs, the programmer may be able to ascertain from looking at a schematic which pins are clocks, which are enables, which are major mode controls. With these limitations on access to information, the process is ineluctably chaotic and undisciplined. The results are therefore not dependable from job to job or from programmer to programmer.

An ordinary custom IC has tens or even hundreds of thousands of logic gates arranged into functions that are usually deeply sequential. It has many tens of pins, often more than 200. Many of the pins are bidirectional. The programmer knows little about how the IC works, the information being hidden either through neglect, error or misguided but deliberate intention of others. Usually, an experienced programmer assigned the task of developing an in-circuit test vector sequence for a complex custom IC is allotted a certain amount of time (say two weeks), and instructed to get the best pin fault coverage available in the time allotted. A PCB with a large number of such IC's may thus spend several months having its in-circuit test program written, unless several programmers can work concurrently on the individual IC's.

There is thus a great need of a way to shorten the time required for in-circuit test vector sequence development, without sacrificing either stability or comprehensiveness of the resulting test vector sequences.

The present invention solves the above-noted discrepancies by providing a method and apparatus for the automatic generation of in-circuit test vector sequences.

SUMMARY OF THE INVENTION

The present invention provides a way to prepare an in-circuit test vector sequence quickly, even when information provided to the human operator about the IC is missing, incomplete, or wrong.

The present invention also provides a way to prepare a PCB-level test for an IC which works even in the presence of board level constraints involving pins tied to fixed voltage levels or to other pins on the same IC.

Another advantage of the present invention is to provide a way to prepare compact, stable, re-usable, consistent tests of known and measured coverage.

Yet another advantage is to enhance production utilization of the production tester, by providing a separate and less expensive apparatus to prepare IC vector sequences.

Still another advantage is to allow for the ongoing modification and improvement of the procedures which create and test the generated vector sequences.

The invention is a tool for preparing in-circuit test vectors. Using the invention, a technician of modest intellectual attainments may prepare in a few hours a sequence of test vectors that would take an engineer of great skill and experience many days using the best of today's conventional methods. The technician using the invention will have been able to do the job even if some of the information about the IC was missing, incomplete or wrong; the resulting test vector sequence will work in the presence of board-level constraints; the test will be stable, re-usable and consistent, of known and measured quality.

The efficacy of the invention may be increased by feeding small amounts of starting information into it. The invention eliminates the need to take a production tester out of service to create and validate the test.

The invention comprises both method and apparatus for preparing in-circuit test vectors for digital IC's. The method is such that it may be used with apparatus other than that described here. A digital test vector sequence prepared with the method of the invention will, in keeping with the spirit of in-circuit testing, cause the ATE to detect static pin faults and thereby report an incorrect, missing, damaged, misoriented or incompletely soldered IC.

More particularly, the invention contemplates the preparation of in-circuit test vectors for an electrical component having accessible nodes, such as contact pins, comprising, establishing test goals for each pin of the electrical component, automatically generating at least one test vector, and applying the at least one test vector to the electrical component, and after application of each test vector, testing whether any of the test goals have been satisfied. If so, the test vectors are stored as learned test vectors, and if not, the process is repeated until a test goal is satisfied. The procedure continues until all test goals are satisfied, or until interrupted by an operator.

The automatic generation of test vectors may employ a pseudorandom number generator.

The invention also contemplates the minimization of the trial block of test vectors by selectively masking certain portions of the trial block, and by applying the unmasked vectors of the trial block to the pins of the electrical component. If the unmasked portion of a trial block is successful in satisfying test goals, the masked portion is discarded, a new, smaller, mask is generated, and is used to further mask the test block. This iterative minimization procedure continues until the mask length reaches a predetermined minimum length, at which time it is concluded that the trial block is at its minimum size.

The invention also contemplates verification of the ability of the trial block to initialize the electrical component by applying the trial block to the electrical component after varying periods of removing and reapplying power to the electrical component.

The invention further contemplates verifying the stability of the test vectors in the trial block by repeatedly perturbing the initial state of the electrical component, and then applying the test vectors of the trial block to ensure that the trial block is capable of testing all test goals.

These and other features and advantages of the invention will become apparent to those of ordinary skill in this technology, with reference to the appended drawings and following detailed description.

BRIEF DESCRIPTION OF THE DRAWINGS

FIG. 2 illustrates the elements of a finished vector sequence for the in-circuit testing of an IC.

FIG. 18 is a some vectors for the first example IC, translated for use by a popular in-circuit ATE in the Teradyne Z1800 series.

FIG. 21 is the Z18xx Ascii Vector Format of the vectors generated for the second example.

DETAILED DESCRIPTION

Figure 1:
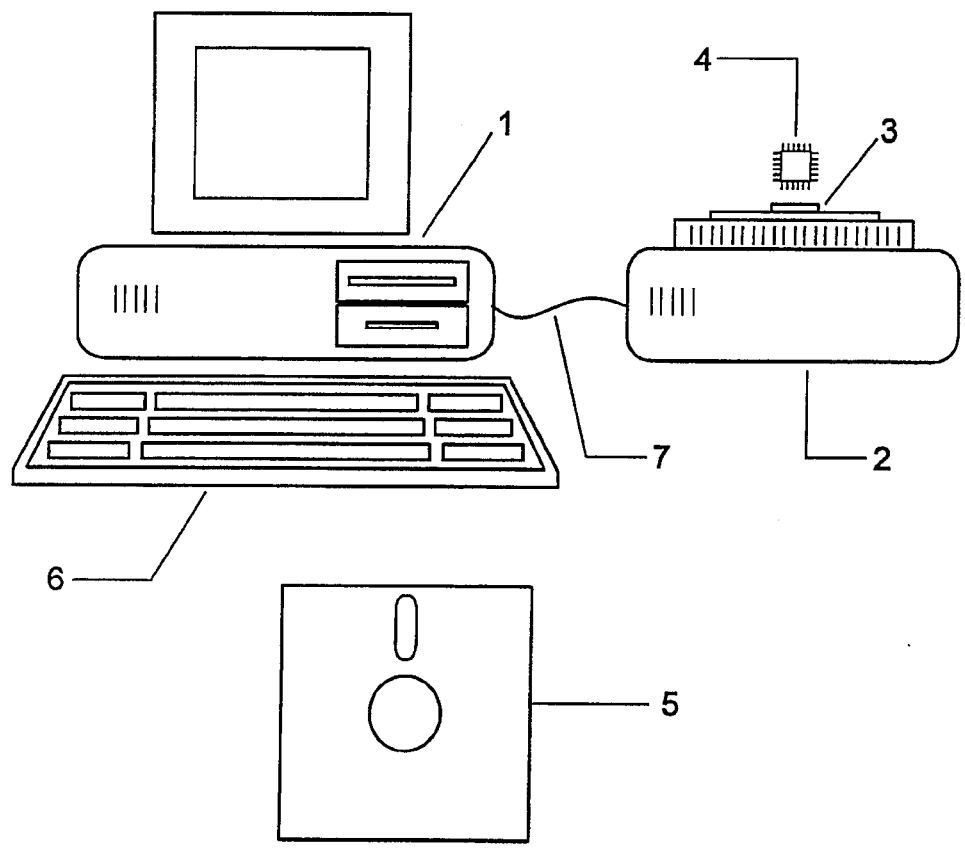
FIG. 1 is the apparatus of the present invention.

The present invention introduces the concept of test vector sequence goals. The term "goal" describes an aspect of the static pin fault coverage of a test vector sequence. Every in-circuit test vector sequence has a set of goals to satisfy with respect to each pin of the complex custom IC it tests. Consider a generalized pin on an IC as having five possible purposes in the circuit of the board under test: if the pin is an input, it may conduct a high or low signal into the IC; if it is a normal two-state output, it may conduct a high or low signal out of the IC; if it is a three-state output, it may assume a high-impedance (also called "high-Z") state in addition to the normal two output high and output low states. The five purposes of IC pins may thus be listed as:

- output high;
- output low;
- output high-Z;
- input high;
- input low.

On any given IC on any given PCB, most pins will serve some of these five purposes but not others. Instead, each pin will have an associated subset of the five purposes. The overall goal of the test vector sequence will be to cause the ATE to detect the inability of any of the IC's pins to serve its designated subset of the five purposes. This overall goal may be broken down into of a list of specific goals for each individual pin on the IC. A test vector sequence satisfies one goal if it verifies the ability of one pin to serve one purpose. Thus a test vector sequence may in the limiting case satisfy up to five goals per IC pin, each goal corresponding to one of the five purposes which a pin may serve in the PCB under test.

If the intended subset of purposes served by a particular pin is known, a set of test goals may be assigned which the test vector sequence must satisfy with respect to that pin. Typically, two goals per pin are necessary and sufficient, even for pins that actually serve all five purposes in the PCB. More specifically, to prove that a pin does not have a static pin fault, a pin must simply show service of two of its purposes in the context of a full-coverage in-circuit test vector sequence. To do this, in turn, it must merely change its logic level (in a way detectable by the ATE) at least once during the test vector sequence. A change of logic level on an output pin will be directly detectable by the ATE. A change of logic level on an input pin will be indirectly detectable by the ATE, through its influence on the behavior of one of the IC's output pins.

A full-coverage test vector sequence for an IC, therefore, may be said to "satisfy" the "goals" of making the tester detect static pin faults on every pin of that IC. Such a test vector sequence carries with it the power to detect any open pin on that IC. When a test vector sequence that satisfies all of its goals is used in an ATE program, it will accept a PCB having a good IC properly connected, but will reject a PCB having an IC with any pin open.

Examples of various possible goal choices and opportunities for various kinds of pins are given immediately below:

A normal two-state output pin offers two natural goals—an output high goal and an output low goal.

An open collector (or open drain, in MOS parlance) output pin offers two natural goals per pin—an output low goal and an output high-Z goal.

An open emitter (or open source, in MOS parlance) output pin offers two natural goals per pin—an output high goal and an output high-Z goal.

A three state output pin offers three possible goals—a high goal, a low goal and a high-Z goal. In practice, it is necessary and sufficient for a vector sequence to satisfy any two of these. Some users insist on all three, although this does not necessarily increase the ability of the vector sequence to detect static pin faults.

An input pin offers two natural goals—input high and input low.

A bidirectional pin is a pin which has purposes both of input and of output on the same pin. Up to five possible goals may exist for a test vector sequence with respect to a bidirectional pin: output high, output low, output high-Z, input high, and input low. To detect static faults on such a pin, the test vector sequence must only satisfy two goals that represent different logic levels. For example, if the sequence satisfies input low and output high goals, it can detect a static fault on that pin, but if the sequence satisfies only input high and output high goals, it cannot reject the PCB for having a static stuck high fault on the pin.

Turning now to the details of the invention, and referring first to FIG. 1, a computer 1 is connected to a hardware unit 2 by means of connecting cable 7. In the preferred embodiment, computer 1 is a "personal computer" of the type generally known in the art as a "PC clone." It is well understood, however, that the services provided by the PC clone could be provided by any of a great number of different kinds of computers.

Hardware unit 2 incorporates a socket 3 which connects channel circuits of the hardware unit 2 to a sample IC 4 for which the test vector sequence is to be prepared. A keyboard 6 provides a control means for introducing operator input into the computer 1. Floppy disk 5 represents one of many possible methods of transferring files of information into or out of the computer 1 and hardware unit 2.

Acting on commands from the computer and procedures therein contained, the hardware unit 2 stimulates the input pins of the sample IC 4 with stimulus logic levels, and detects response levels on its output pins. After a human operator enters some initial information in a setup step, computer 1 uses trial and error goal searching and minimization methods to compose and verify a complete in-circuit test vector sequence. During the running of these procedures, comprehensiveness of the test vector under composition is continually reported. The operator may intervene at any time to approve partial results or to modify the setup information and thus affect the ultimate course and outcome of the goal-searching and minimization procedures.

It is understood that although the preferred embodiment finds the hardware unit 2 and computer 1 in separate chassis connected by a cable 7, it would easily be possible to combine the computer 1 and hardware unit 2 into a single common chassis, and eliminate the cable 7, without departing from the spirit of the invention.

The hardware unit 2 is equipped at a minimum with at least the number of channels necessary to serve all the pins on the sample IC 4. In the preferred embodiment there are 512 channels, but the invention is not restricted to this number and may easily be built to service a larger or smaller number as requirements of the day and the purse of the user dictate. Each channel is required to provide the following features as a minimum:

Ability to drive an input on the sample IC to a logic L (low) or logic H (high) level, through a controlled source impedance.

Ability to assume a prescribed impedance/voltage state when not driving to either of the L or H levels. In the preferred embodiment, the channel can supply an impedance of 10,000 ohms to a voltage midway between the L and H voltage levels.

Ability to detect and resolve the level of an output pin on the IC as a U (up) or D (down) or third, high-impedance, state X.

In this embodiment, third-state detection is done without causing an excursion on the pin of the sample IC. This approach was chosen to avoid introducing unwanted transitions on pins that might be inputs as well as three-state outputs, e.g. bidirectional pins.

Figure 13:
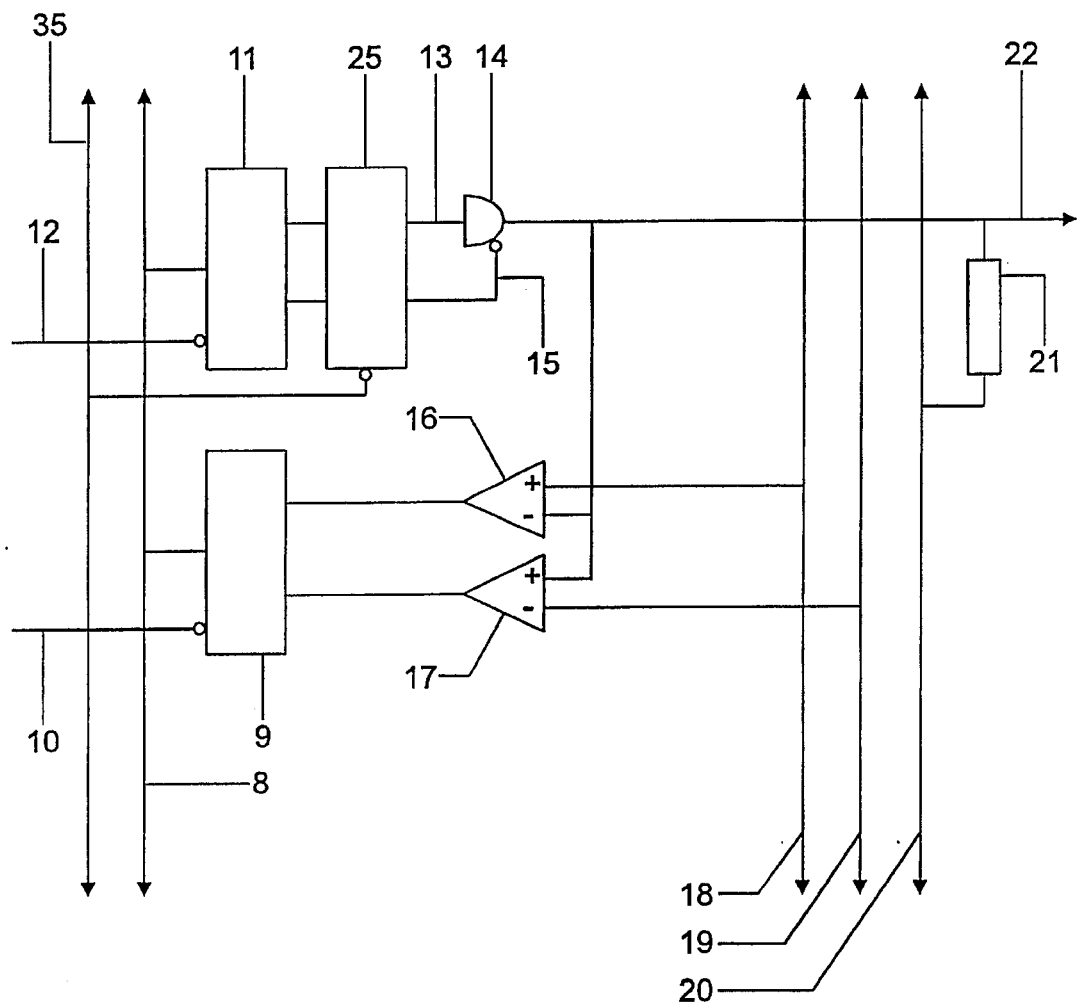
FIG. 13 is a block diagram of the electronic hardware for one channel circuit of the hardware unit in accordance with the present invention.
Figure 23:
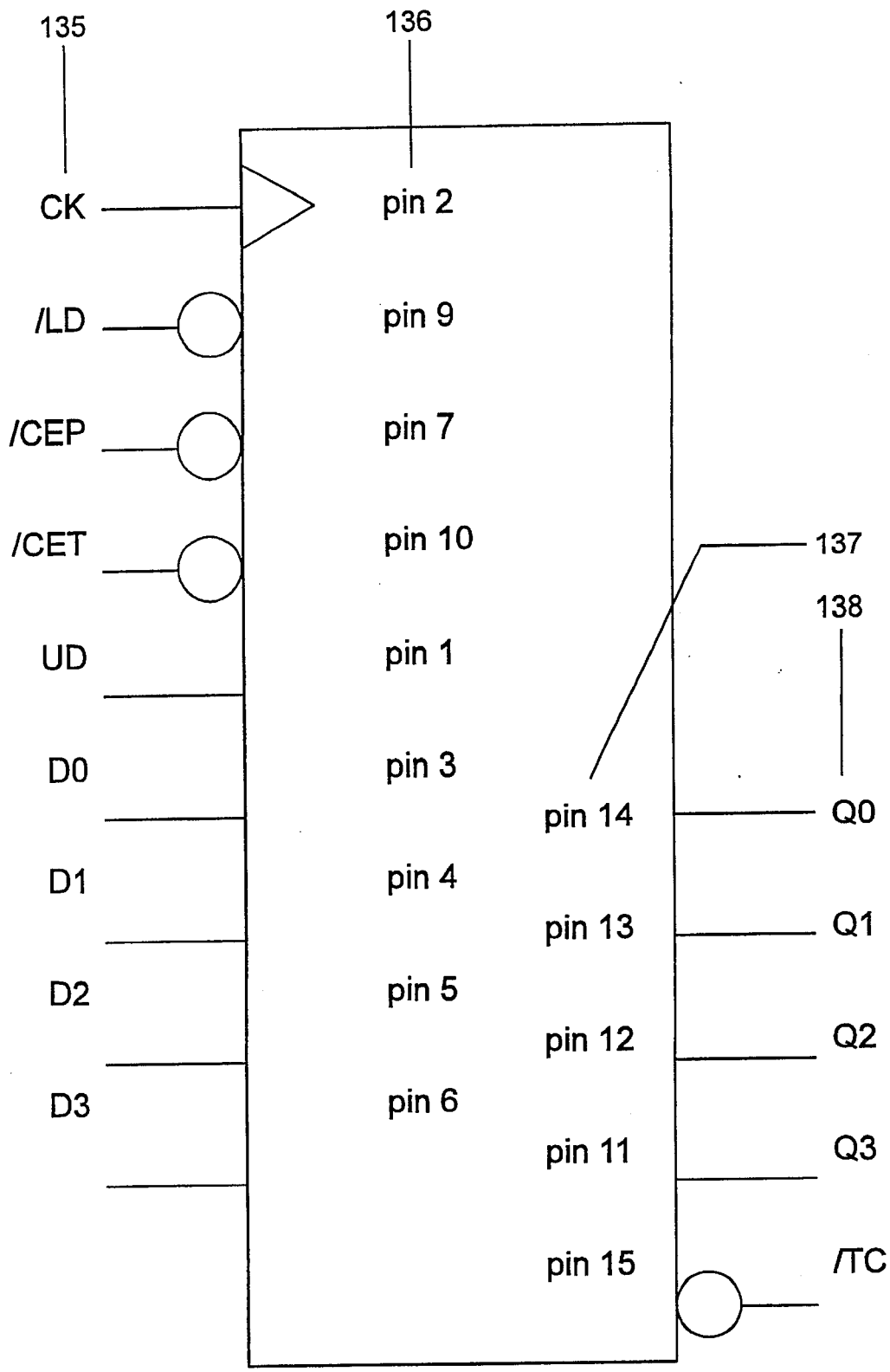
FIG. 23 is the second example, the counter IC.

FIG. 23 is a channel circuit in the preferred embodiment of the hardware unit 2. It is understood that FIG. 13 is but one of many possible channel circuit designs, and that a wholly different channel circuit design could be substituted without deviating from the spirit of the invention. In this embodiment, the following well-known component types are used for the functions indicated in the discussion which follows:

Latches 11 and 25: 74ACT377

Input port 9: 74ACT244

Three state gate 14: 74LS126

Comparators 16 and 17: LM339

Five elements in FIG. 13 span multiple channels: data bus 8; reference voltages 18 and 19; global latch signal 35 and high-Z detection voltage 20. If the number of channels in a given hardware unit is large, it is understood that these five elements may be multiply buffered, each buffer serving a separate group of channels. It is further understood that a version of the invention intended to work with complex IC's having two or more groups of pins, each group belonging to a different logic family, may be equipped with separate groups of channel circuits, each group serving the logic-level needs of a particular logic family.

To assert a logic level on channel pin 22, the computer 1 or other processor connected to data bus 8 uses latch enable signal 12 to write appropriate logic signals from data bus 8 into output latch 11. After performing this operation on all affected pins for one vector, the computer 1 or other processor pulses the global latch enable signal 35, transferring outputs in parallel from output latches 11 to global latches 25.

The level supplied to the three-state gate output enable signal 15 must be low in order to enable the output of the three-state gate 14 to assert its output state as a level on pin 22. The output thus asserted will be high or low according to the level latched in global latch 25 and supplied to data input 13 of the three-state gate 14.

To place channel pin 22 in its unasserted, high impedance, or high-Z, state, and thus allow the channel to be used to read the level supplied to pin 22 by the sample IC, the computer 1 or other processor connected to data bus 8 would write a word into latches 11 and 25 causing three state gate output enable 15 to be high and thus disable three state gate 14.

To read the state of pin 22, the computer 1 or other processor connected to data bus 8 uses input port enable signal 10 to input a word from input port 9. Input port 9 in turn is driven by the output states of high threshold comparator 16 and low threshold comparator 17. High threshold reference voltage 18 and low threshold reference voltage 19 are supplied from a central resource in the hardware unit. For a sample IC made on a 5-volt CMOS process, the high threshold would ordinarily be approximately 3.5 volts and the low threshold would be approximately 1.5 volts. Using this facility, the computer 1 or other processor connected to data bus 8 may determine whether or not pin 22 is above the high threshold, below the low threshold, or between the high and low thresholds.

The comparators 16 and 17 are used to detect levels on output pins of the sample IC 4, and are also used to perform self-tests on the hardware unit 2.

The sample IC 4 may have more than one kind of output circuit. In particular, some outputs are three-state, and will act as normal outputs only when enabled, perhaps even acting as inputs during times when they are disabled as outputs. Other outputs are "open collector" or "open drain," etc. and can only pull in one direction. It is important to be able to identify such pins and learn how they behave during the progress of a test vector sequence.

Accordingly each channel circuit is equipped with high-Z detection resistor 21 connecting pin 22 to the high-Z detection voltage 20. The nominal value of resistor 21 in the preferred embodiment is 10,000 ohms, it being understood that resistors of many different values would be serviceable, and that different resistor values would be appropriate to different logic families.

High-Z detection voltage 20 is produced by a central resource 23, and may be set to a variety of levels on command from the same computer or other processor which is connected to data bus 8. After asserting the stimulus portion of a vector and setting the high-Z detection voltage 20 above the high threshold voltage 18, the computer 1 may read the state of the channel pin 22, then set the high-Z detection voltage below the low threshold 19, and read the state of channel pin 22 a second time. If the first reading is high but the second reading is low, it may be concluded that the relevant output pin of the sample IC is in a high impedance state during this vector.

Alternatively, and to much better effect, the high-Z detection voltage may be set to a point between the two comparator reference voltages 18 and 19. Then, the computer 1 may determine whether or not the sample IC's output pin is in a high impedance state by taking a single reading: if the IC is pulling high, the signal level will be above the high threshold; if it is pulling low, the signal level will be below the low threshold; if the sample IC's output is in a high impedance state, however, the signal level will fall between the two levels, and be observed as neither a high nor a low. This second approach, further refined by using a constant high-Z detection voltage set slightly below the high threshold reference voltage 18, yet comfortably above the input high threshold of the input of the sample IC, has an additional advantage: it guarantees that unwanted input transitions do not get injected into the sample IC in the course of testing for the high-Z condition, as would happen if the high-Z detection voltage were taken through an excursion as described in the first approach.

Figure 14:
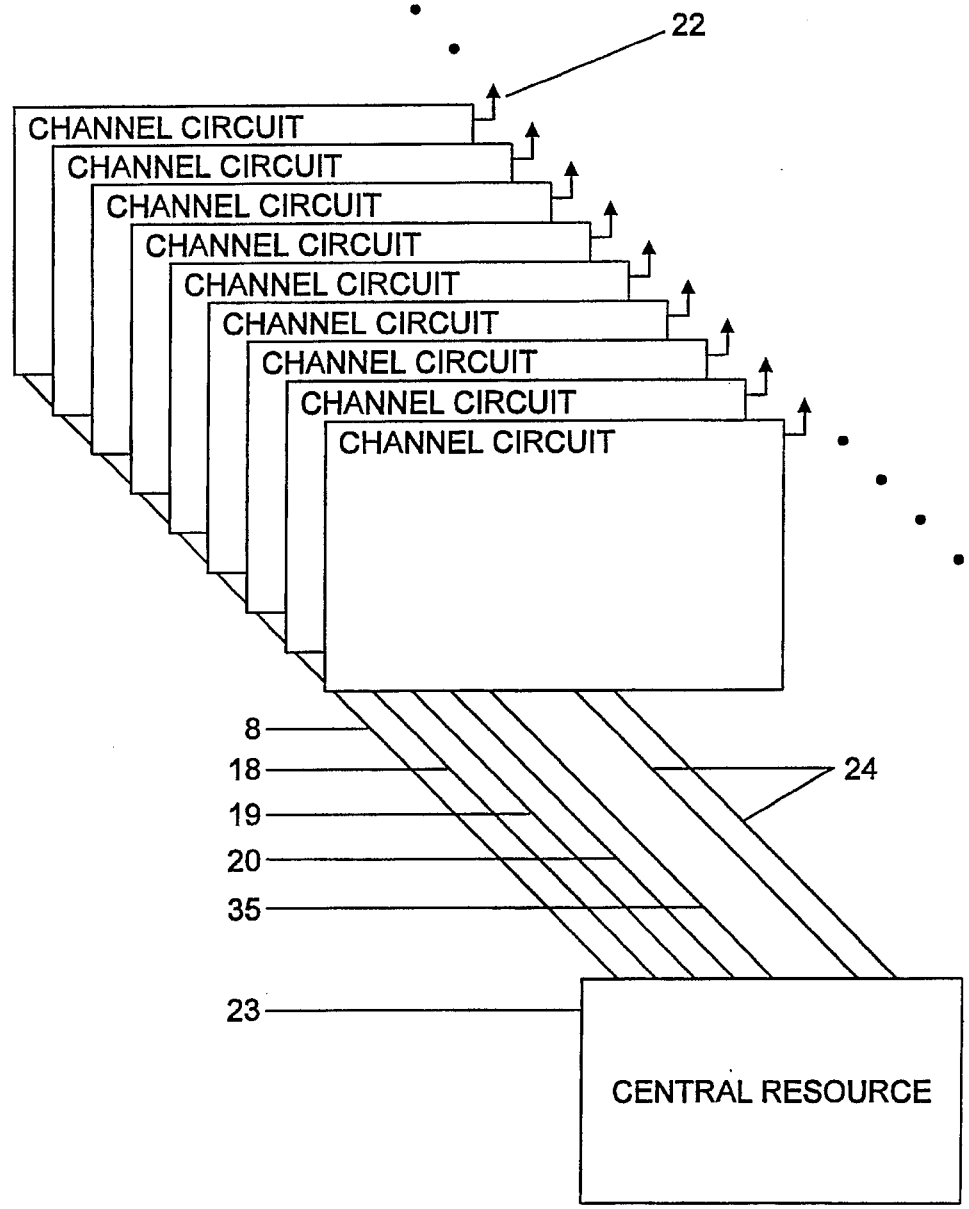
FIG. 14 is a block diagram of a number of channels served by a central resource in the hardware unit in accordance with the present invention.

FIG. 14 is in block diagram form a number of channel circuits and a central resource facility 23 in accordance with the present invention. In this block diagram, individual channel circuits are shown one per block in order to distinguish one from the next and to stress the notion that the apparatus contains many independent channel circuits. In this embodiment, the channel circuits are packaged 128 per subassembly, and there are 4 subassemblies for a total of 512 channels. In practice, any number of channels could be supplied without deviating from the scope or spirit of the invention.

The details of the hardware unit's central resource are not minutely described here: anyone of ordinary skill in the art, given the descriptions and intent described here, may implement the necessary computer or other processor connected to data bus 8, or as in the case of our preferred embodiment, implement an interface to a computer 1 physically separated from the hardware unit 2. Likewise a simple address decoding scheme, well known in the art, can produce individual enable signals 10 and 12 as needed for each individual channel circuit and global latch signal 35. High and low threshold voltages 18 and 19, and high-Z detection voltage 20 can be generated by a variety of well known circuitry designed without further guidance from the present inventors.

A person skilled in the ATE art will also know that additional services 24 are needed to make the circuitry operate. These include power supplies, initialization, cooling and the like. The additional services 24 may take any of many well known forms, and therefore do not need to be described in detail here.

It is understood that many possible architectures may be imagined which would provide the required features stated for channel circuits and central resources. The invention is not limited to the circuitry shown here which is presented only for illustrative purposes so that the reader will be enabled to understand and make the invention. Memory-backed channel circuits such as are used abundantly in the ATE art, for example, could also be used to generate input signals to the sample IC and to receive output signals from it. Indeed, the procedures of the invention could be made to work directly on many kinds of existing conventional ATE or on hardware modeling systems used with computer-aided engineering (CAE) workstations.

Figure 2:
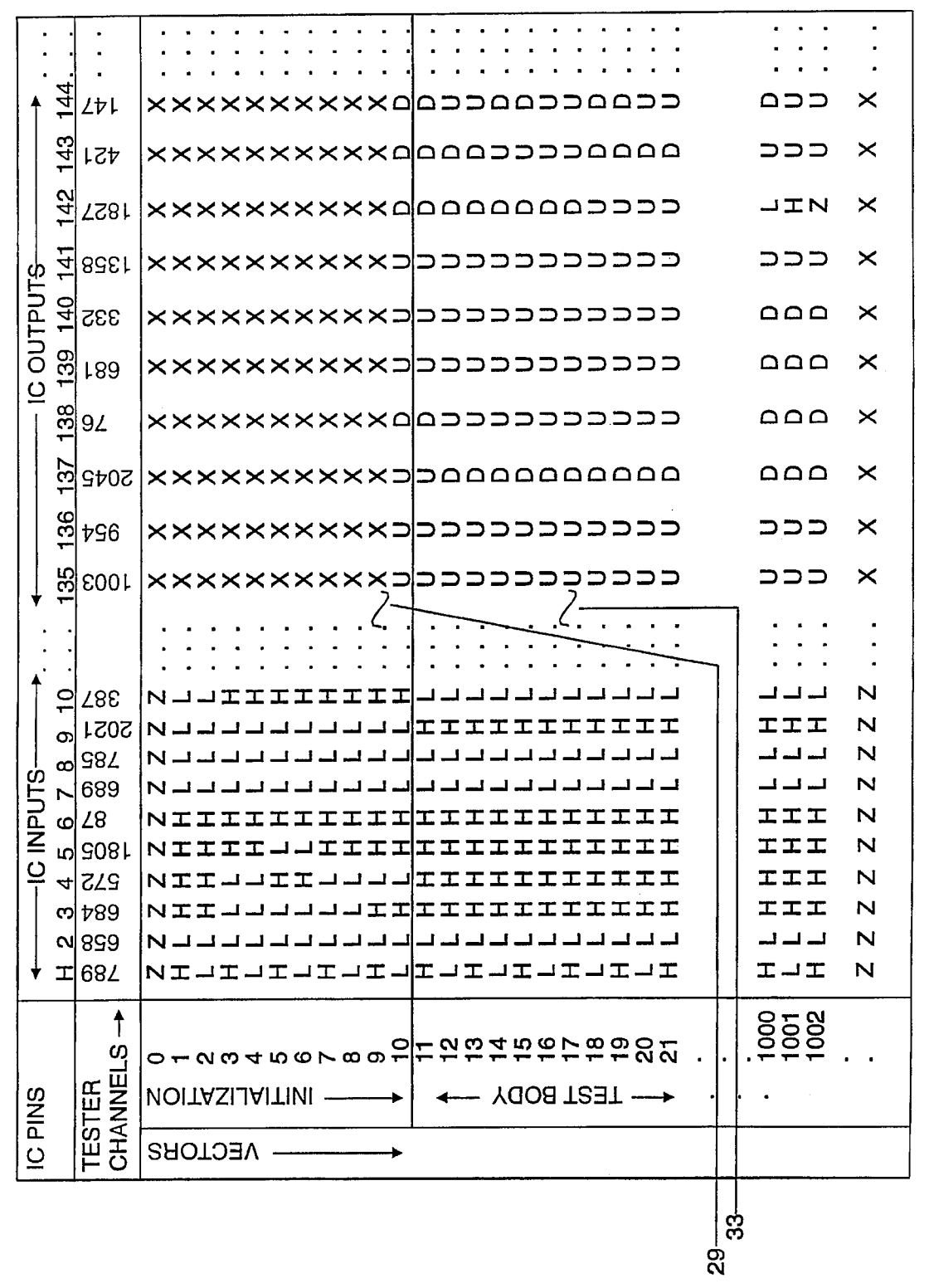

FIG. 2 diagrammatically highlights the significant elements of a typical sequence of in-circuit test vectors. In FIG. 2, the IC on the board under test has a large number of pins, only 20 of which are shown in FIG. 2. Pins designated as IC input pins 1 through 10 are explicitly numbered, and the fact that there are more than ten inputs is indicated by ellipsis. Likewise, the pins designated as IC output pins 135 through 144 are explicitly shown, and ellipsis indicates the existence of others beyond pin 144.

Immediately under the IC pin numbers are the tester channel numbers. These are indicative of the wiring in the in-circuit test fixture for a PCB containing the IC. As is well known in the in-circuit testing art, each pin of the IC under test is normally connected to a particular circuit node consisting of printed metallic wiring in the PCB under test. Each such circuit node is in turn served by a particular ATE channel, the service normally being provided by means of a wire and spring probe in a bed-of-nails fixture.

Each tester channel numbered in FIG. 2 is therefore normally to be connected through the fixture and PCB traces to a particular pin of the IC to be tested by this particular test vector sequence. If the IC is wrong, missing, broken or misoriented, or if one or more of its pins has not been properly soldered to the right PCB trace, the connection pattern will be altered, the tester will not detect the correct signal levels at the intended points in the vector sequence, and the test will not pass.

Vectors are numbered in the left hand column. Space permits the display of only vectors 0 through 21 and 1000 through 1002, the remaining vectors being indicated by ellipsis. It is not necessary for the reader to see all pins and all vectors to understand the purposes and methods of the invention.

Logic levels for stimulating IC input pins are labeled either Z, H or L: L indicating a logic low stimulus, H indicating a logic high stimulus, and Z indicating that the driver is to be placed in a high-impedance state. These labels instruct the tester what logic levels to assert on each stimulus channel at each vector.

For each point labeled H, the indicated tester stimulus channel asserts a logic H level. For each point labeled L, the indicated tester stimulus channel asserts a logic L level. For each point labeled Z, the indicated stimulus channel does not assert any signal, instead assuming a high impedance condition for the duration of the vector.

If an IC input pin is in fact properly connected to its circuit node, it will be stimulated with the indicated level (or high impedance state in the case of a Z) during the time slice associated with the vector specifying the H, L or Z. If an input pin is not properly connected, it will not receive the stimulus from the tester: The IC will not go through its intended progression of states, and its output pins (see below) will not be found at the expected levels at the expected vector times. Expected levels on output pins are labeled U (accept up), D (accept down) or X (accept any level). These labels instruct the tester what levels to expect on its receiving channels when measuring logic levels during the time slice associated with each vector. The tester will actually be measuring the state of the tester channel connected to the circuit node in the PCB under test that is in turn expected to be connected to a particular output pin of the IC.

For each point labeled U, the tester expects an "up" logic level and will reject if it detects a level that is not up for each point labeled D, the tester expects a "down" logic level and will reject if it detects a level that is not down. For each point labeled X, the tester will accept any logic state as a passing value, and will not reject. State X is also known in the art as a "don't care" state.

If each output pin of the IC is properly connected to the PCB, and therefore through the test fixture to its designated tester channel, the tester channel will detect the expected levels on its receiving channels, and the signal will compare accurately to the expected level.

As noted earlier, many IC's have "three state" output pins, some of which may serve the IC as both inputs and outputs at different times during the test vector sequence. Although a pin fault on a bidirectional pin on an IC can often be made to propagate to another output pin, three-state pins are usually easier for the ATE to test as outputs. One three-state pin is shown in FIG. 2 as IC pin 142, which is served by tester channel 1827. Note that the levels assigned to this pin in the early part of the vector sequence are labeled U, D or H (indicating that the pin is to be tested as an IC output), but that levels L, H and Z (indicating that the pin is to be stimulated by the ATE) are called for later in the sequence.

The channel circuits of most ATE's are able to stimulate and receive independently. Their driving circuits can go into or out of the Z (high impedance) condition at any vector. Accordingly, a channel may assert a stimulus on its associated IC pin during one vector, and then receive a signal from the same IC pin during the next vector.

A further aspect of FIG. 2 is that it emphasizes the division of the vector sequence into an "initialization" section 29 and a "test body" section 33. A complex IC is usually a sequential IC, and it may be in any state when the test program first turns its attention to it. The tester may therefore need to apply a sequence of several vectors to the IC to bring it to a known state (unless the IC designer has provided a direct overriding reset function). Only after the IC is in that known state will it make sense to allow the tester to apply additional vectors with the purpose of detecting and reporting pin faults.

The "Initialization" section 29 in the example of FIG. 2 comprises vectors #0 through #10. It is understood, however, that any number of vectors may be required to accomplish initialization of an IC under test. Note that the tester is programmed to ignore the levels on all outputs from vector #0 through vector #9. IC output levels cannot contain any fault information during those vector times, and cannot be depended on to be repeatable due the IC not being in a known state when vector #1 was applied. By the time vector #10 arrives, though, the initialization of the IC is complete. All internal registers, and therefore all output pins, will have attained the expected starting state.

The "Test Body" section 33 immediately follows the initialization section 29, beginning at vector #11. It drives the IC through a series of states intended to immediately reveal static pin faults on outputs and to propagate static pin faults from input pins to output pins. "X" states may occur from time to time in the test body as well, for a variety of reasons. For example, they may be three-state pins and have been placed in their high-Z states in response to certain parts of the vector sequence. But in general, the test body is the part of the test where responses from the IC must meet rigid and unchanging expectations, and where pin faults on input or output pins will be reported.

Creating such a table of pin levels for a complex custom IC, and assessing the comprehensiveness of its coverage using known techniques, is a lot of mental hard work. Individuals who are capable of this work, and who have the patience to do it well, are rare, work slowly, and command high salaries. In automating large parts of the process of creating test vector sequences, the present invention allows this process to be conducted much more effectively.

As noted above, the finished test vector sequence has an initialization section 29 and a test body section 33. During the preparation of a test vector sequence in accordance with the present invention, each of the two sections is further divided into three blocks: an approved block, a learned block, and a trial block. The procedures maintain these blocks as separate data structures in the manner described below.

Figure 3:
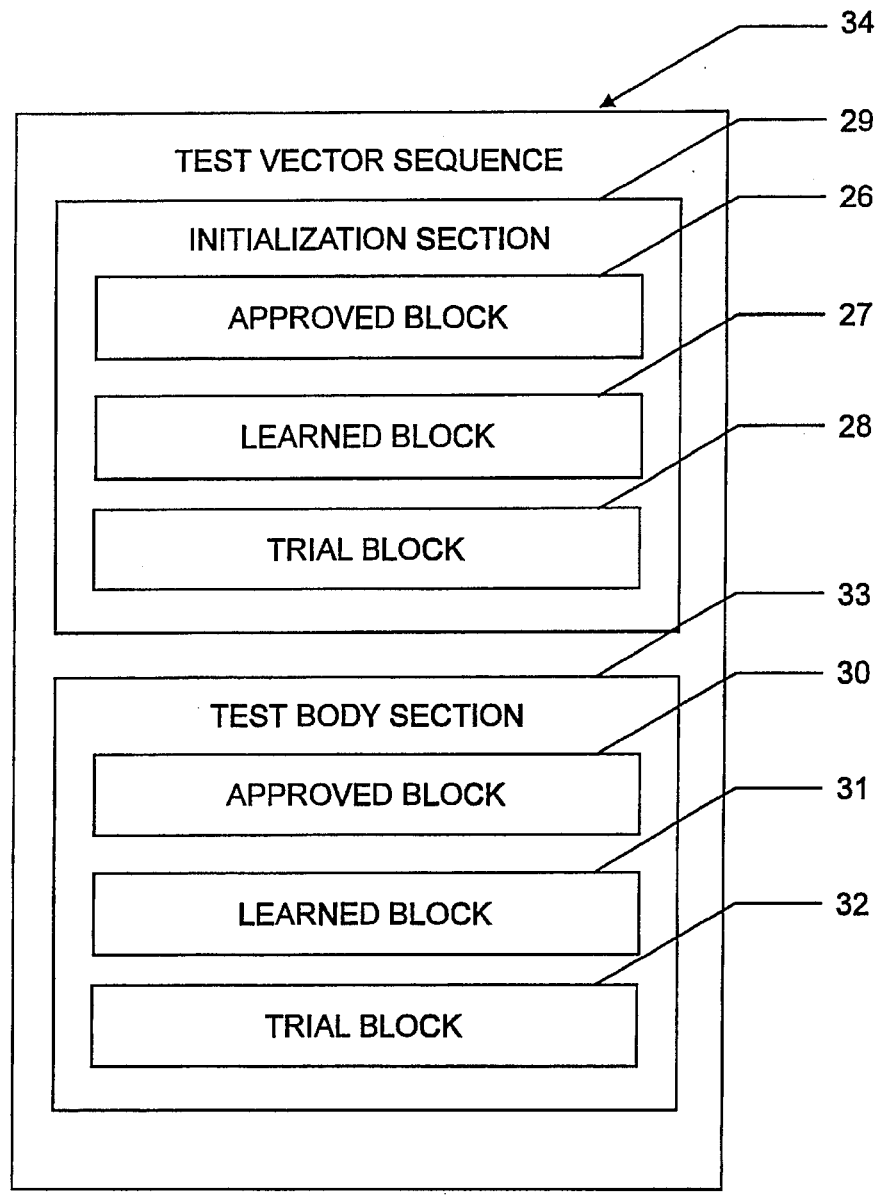
FIG. 3 illustrates the two main sections and six main blocks of a vector sequence while it is being composed in accordance with the present invention.

FIG. 3 is a block diagram view of a vector sequence 34. It is composed of an initialization section 29 and a test body section 33. The initialization section 34 contains an approved block 26, a learned block 27 and a trial block 28 in the initialization section 29, and an approved block 30, a learned block 31 and a trial block 32 in the test body section 33.

In either section, the approved block may be edited by the human operator, and is never disturbed by any automatic or algorithmic processes. It is called the approved block, therefore, because it contains only items that have been approved by the human operator. The human operator, if desired, may also compose vectors and write them anywhere in the approved block. The approved block is also a text buffer into which the human operator may write goal statements.

In either section 34 or 33, the learned block 27 or 31, respectively, is a series of vectors which is created by the goal-searching and minimization procedures of the present invention. If the human operator is happy with the operation of the vectors in the learned block, the operator approves them, thus including them in the corresponding approved block 26 or 30 and erasing the learned block 27 or 31.

In either section 29 or 33, a trial block 28 or 32 respectively is provided as temporary workspace for the goal searching and minimization procedures of the present invention. If the vectors in a trial block 28 or 32 are accepted by the procedures, the procedures automatically append the contents of the trial block to the end of the corresponding learned block 27 or 31.

It is well understood by anyone skilled in the modern software art that the traditional flow chart format is at best a macroscopic one, and that many aspects of modern software, particularly at the top level of a menu-driven system, cannot be fully described at all in traditional flow chart form. Accordingly, the following verbal description will elaborate on the details not visible in the flow charts FIG. 4 through FIG. 12 and FIG. 22.

Figure 4:
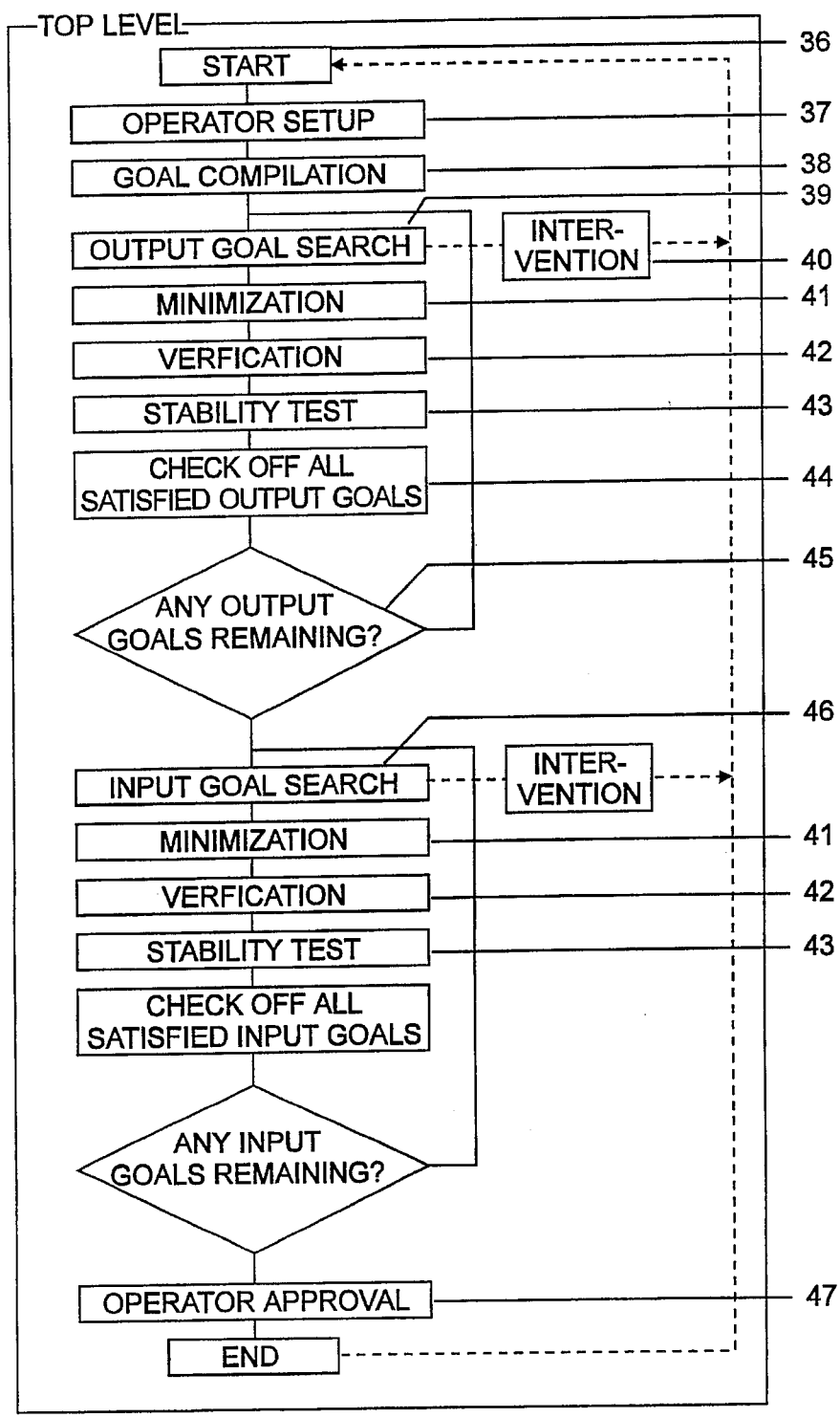
FIG. 4 illustrates the method of the present invention in flow chart form.

FIG. 4 illustrates in flow chart form the top level operations of the present invention some of which are performed by the human operator and others automatically. The step marked Start 36 is actually a menu selection program which may take the human operator quickly to the desired one of several utility routines in the software system or steps in the flow chart of FIG. 4. The flow chart of FIG. 4, therefore, should be interpreted as showing a typical path which a human operator might take in the course of preparing a test vector sequence, rather than as showing a prescribed start-to-finish path imposed by a computer program and traversed in exactly the same way each time.

The step in FIG. 4 marked Operator Setup 37 offers an opportunity for the human operator to describe what is known of the sample IC, and, if desired, to edit the approved blocks 26 and 30 of the vector sequence being prepared. In this step also, the operator declares whether the immediate object of the ensuing output goal search will be an initialization section 29 or a test body section 33. The Operator Setup step 37 is broken into more detail as FIG. 5.

After Operator Setup step 37, the operator will compile the goals using the Goal Compilation step 38. Goal compilation is an automatic process, and is expanded into more detail in the discussion of FIG. 7.

Having compiled the goals for rapid processing by the goal searching and minimization procedures, the operator may direct the invention to search output or input goals. Normally, as shown in FIG. 4, output goals are searched first, in the Output Goal Search step 39. Output Goal Search step 39 contains an important procedure, and is expanded into more detail as FIG. 8.

Output Goal Search step 39 may take a long time to complete, left to itself, a way is provided for the human operator to intervene and return to the Top Level Start step 36. The operator may wish to perform some changes in setup by re-running setup step 37. Intervention is illustrated in FIG. 4 as the "Intervention" step 40.

Minimization step 41 is provided to reduce the number of vectors in the trial block to the minimum needed to attain a previously unsatisfied goal. Minimization 41 will be described in more detail in the discussion of FIG. 10.

Verification 41 and stability test 43 establish the robustness of the vector sequence. These procedures are described in the discussion of FIG. 11 and FIG. 12 respectively.

In the step labeled 44, the goals that have been attained are checked off. If any unsatisfied goals remain, the operator may elect to let the invention work on them some more, or may elect to leave them unsatisfied. This choice is shown as the diamond 45 containing the words "Any Output Goals Remaining?"

The part of the process for searching input goals is structurally similar to that mentioned above for searching output goals, although the "Input Goal Search" step 46 is internally different from the "Output Goal Search" step 39. The differences between input goal searching methods and output goal searching methods will be explained in the discussion of FIG. 9, the input goal search procedure.

After minimization, etc. of the vectors that were created to catch input faults, the operator may approve the results in operator approval step 47. The internal structure of operator approval step 47 is detailed below in the discussion of FIG. 6.

To conclude the discussion of FIG. 4, note that steps exit as appropriate either down to the next step, or to the dotted line on the right, which represents the path back to the menu system represented by "start" 36.

Figure 5:
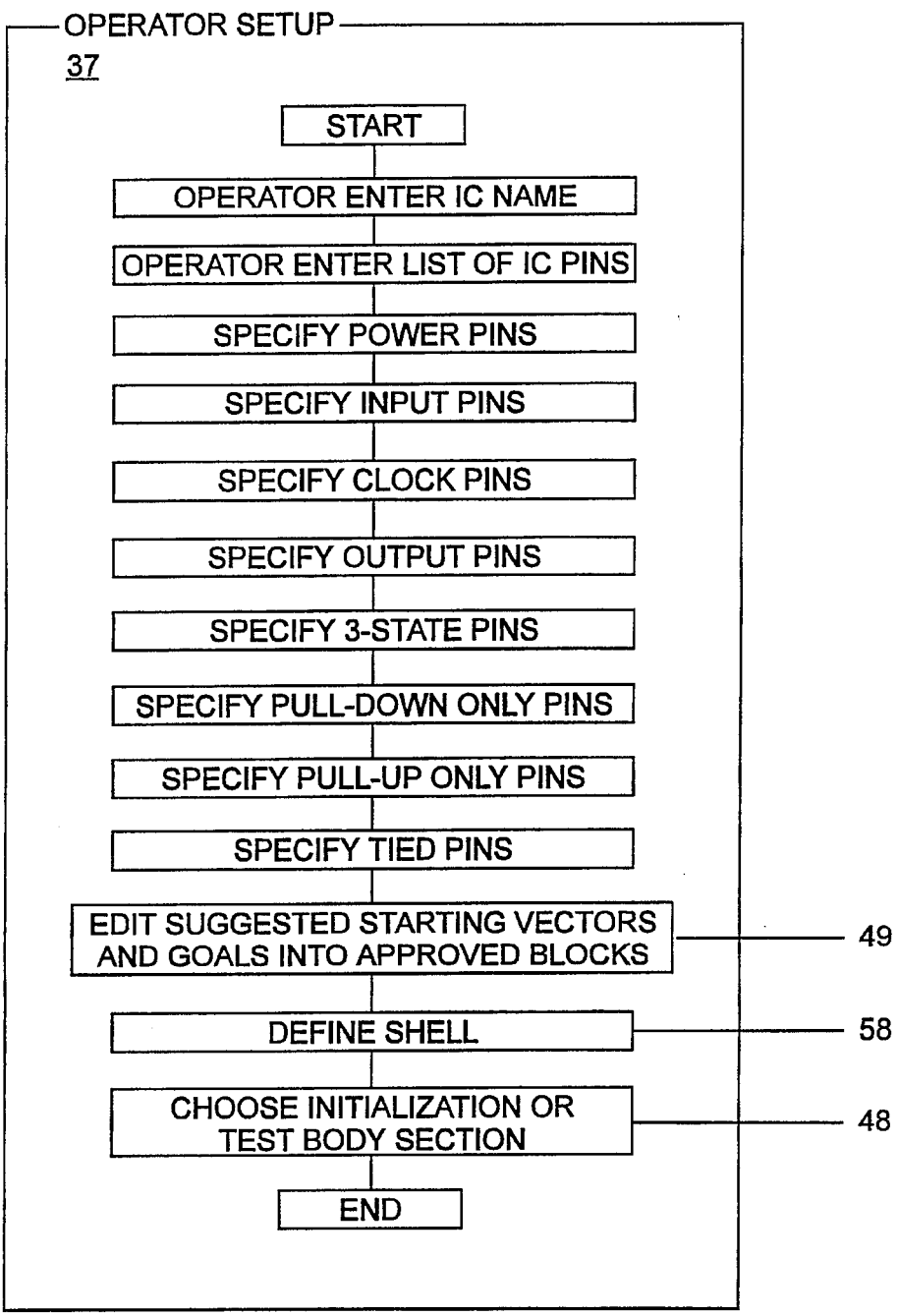
FIG. 5 is a flow-chart illustration of the operator setup procedure.
Figure 15:
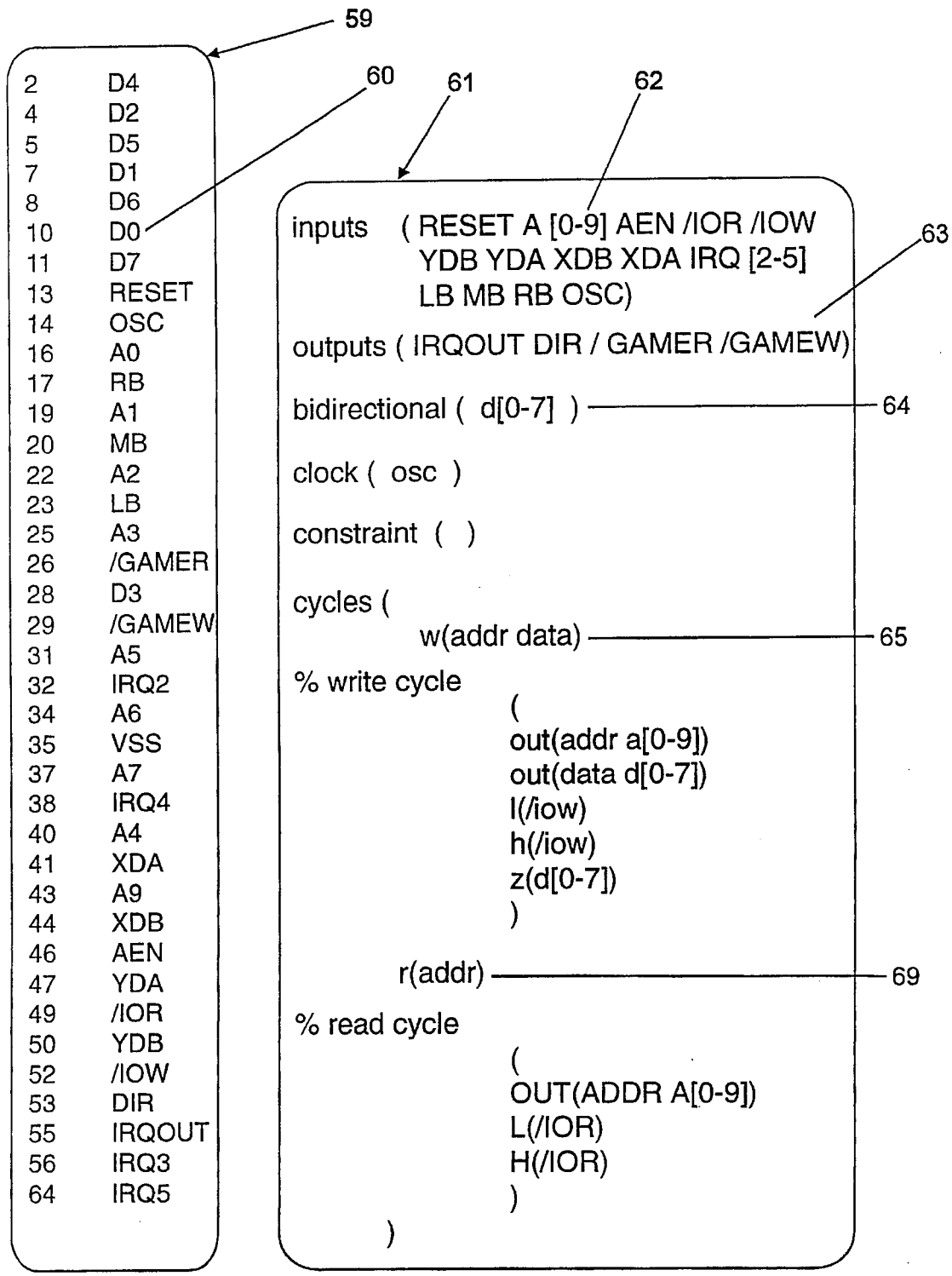
FIG. 15 is a pin list and shell that result from performing the setup procedure on a first example IC.
Figure 17B:
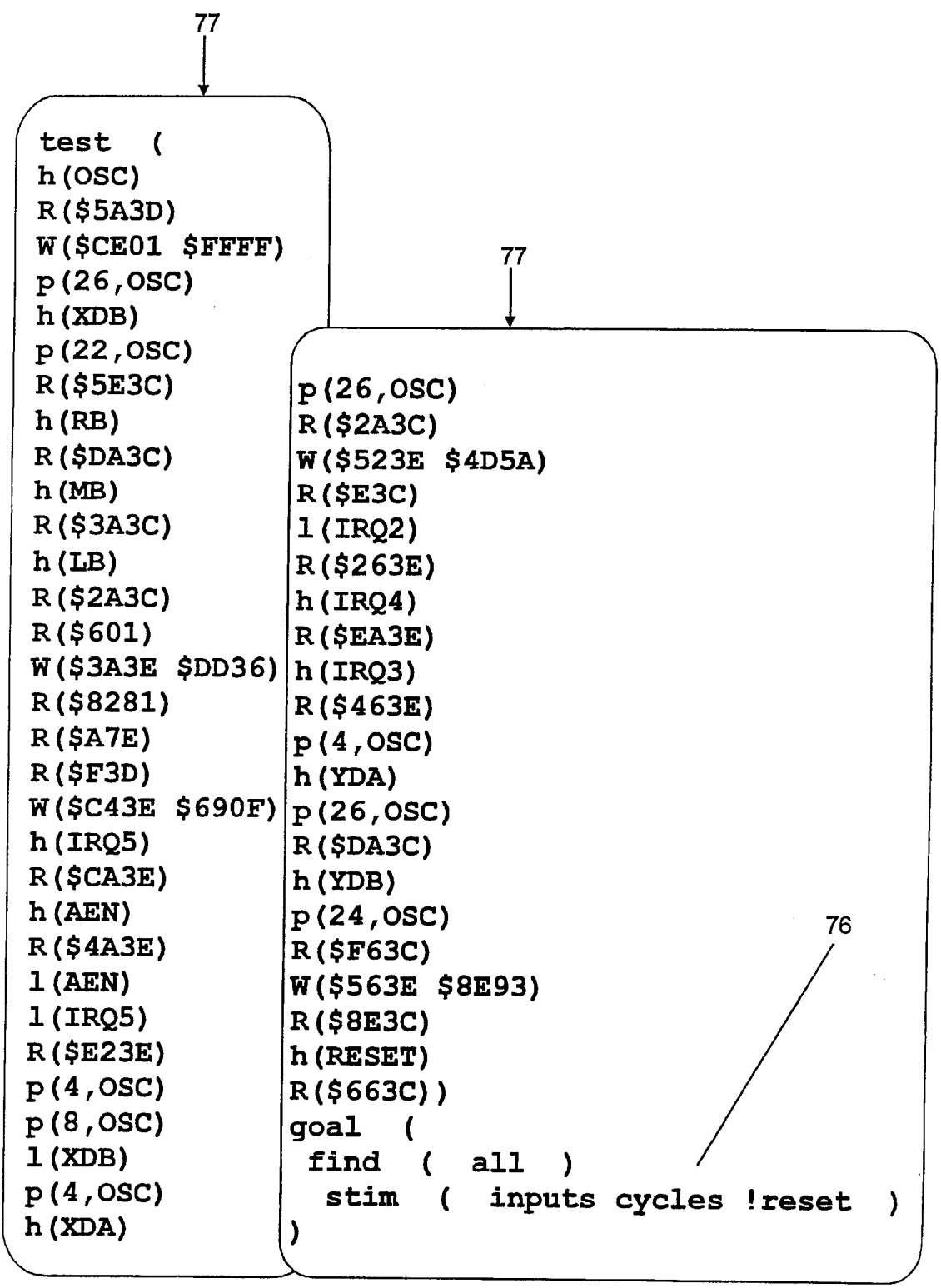
FIG. 17 is a vector items and goals for the first example IC, expressed in the internal language of the invention.

FIG. 5 shows the major subcomponents of Operator Setup step 37. Like the top level flow chart in FIG. 4. The setup step offers the human operator a set of choices, and the operator may for the most part execute them in any desired order. Most of the steps in FIG. 5 have to do with specifying starting vectors, goals or other information in the shell, pin list and approved blocks, which will in turn be processed in Goal Compilation step 38. The shell and pin list are illustrated in FIG. 15, which will be discussed in turn. FIG. 17, also to be discussed in turn, illustrates contents of approved blocks containing vectors and goal statements.

Another function of the operator setup step 37 is to decide whether the subsequent processing will be for the initialization section 29 or the test body section 33.

Although the goal searching procedure does not insist on having any fore knowledge, it will generally produce better results more rapidly when given a few vectors head start. Accordingly FIG. 5 provides the "edit suggested starting vectors . . . " step 49. This gives the human operator an opportunity to directly hand-edit vectors in either of the approved blocks 26 or 30. Referring also to FIG. 17, which shows typical contents of some approved blocks, some goal statements 75 and 76 are shown that the operator has edited into the "approved" blocks.

When all setup operations are complete, the flow of FIG. 5 returns to the top level, FIG. 4.

Figure 6:
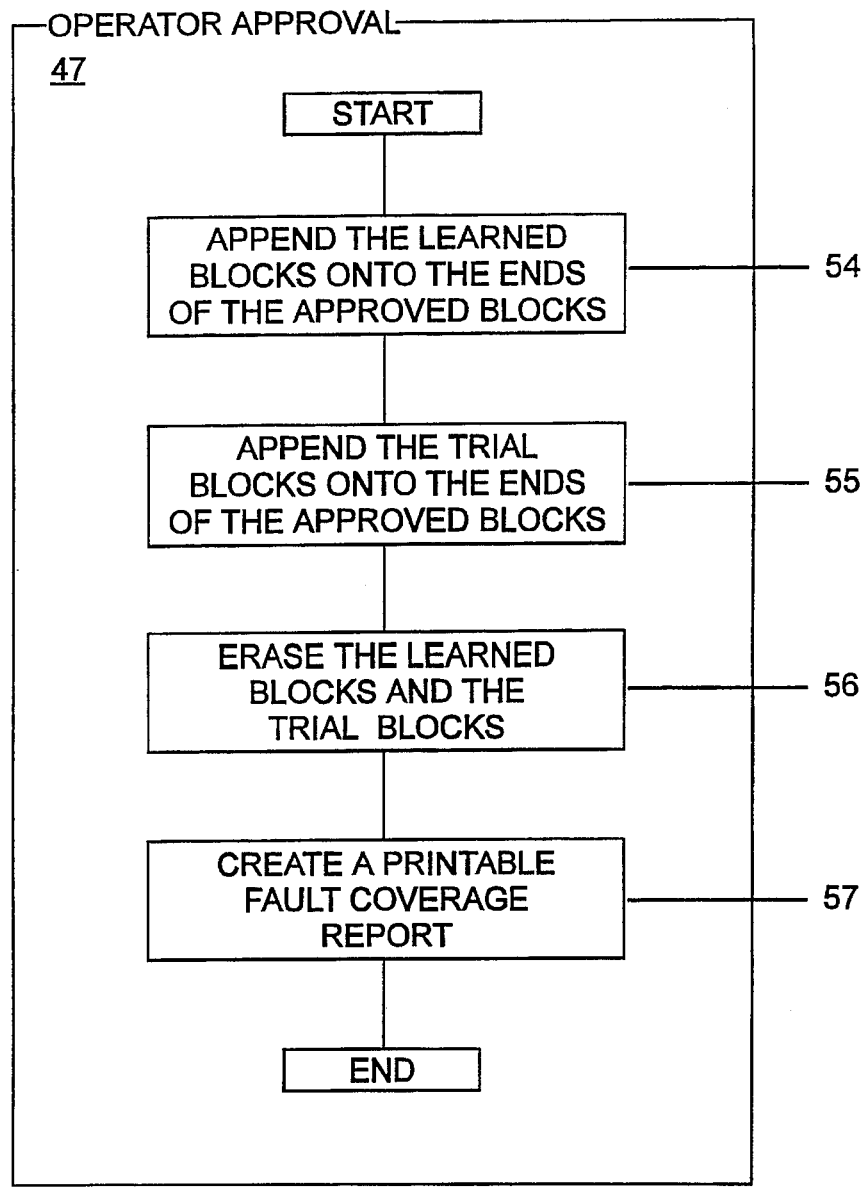
FIG. 6 is a flow-chart illustration of the operator's procedure for approving newly composed parts of the vector sequences prepared by the invention and incorporating them into a single sequences.

FIG. 6 illustrates the process of operator approval step 47. In step 54, the learned blocks are appended to the approved blocks. In step 55, the trial blocks are also appended to the approved blocks following the vectors formerly belonging to the learned blocks. In step 56, the trial and learned blocks are erased thereby being prepared for more learning activities by the goal searching and minimizing procedures. In step 57, a printable pin fault coverage report is produced.

Figure 7:
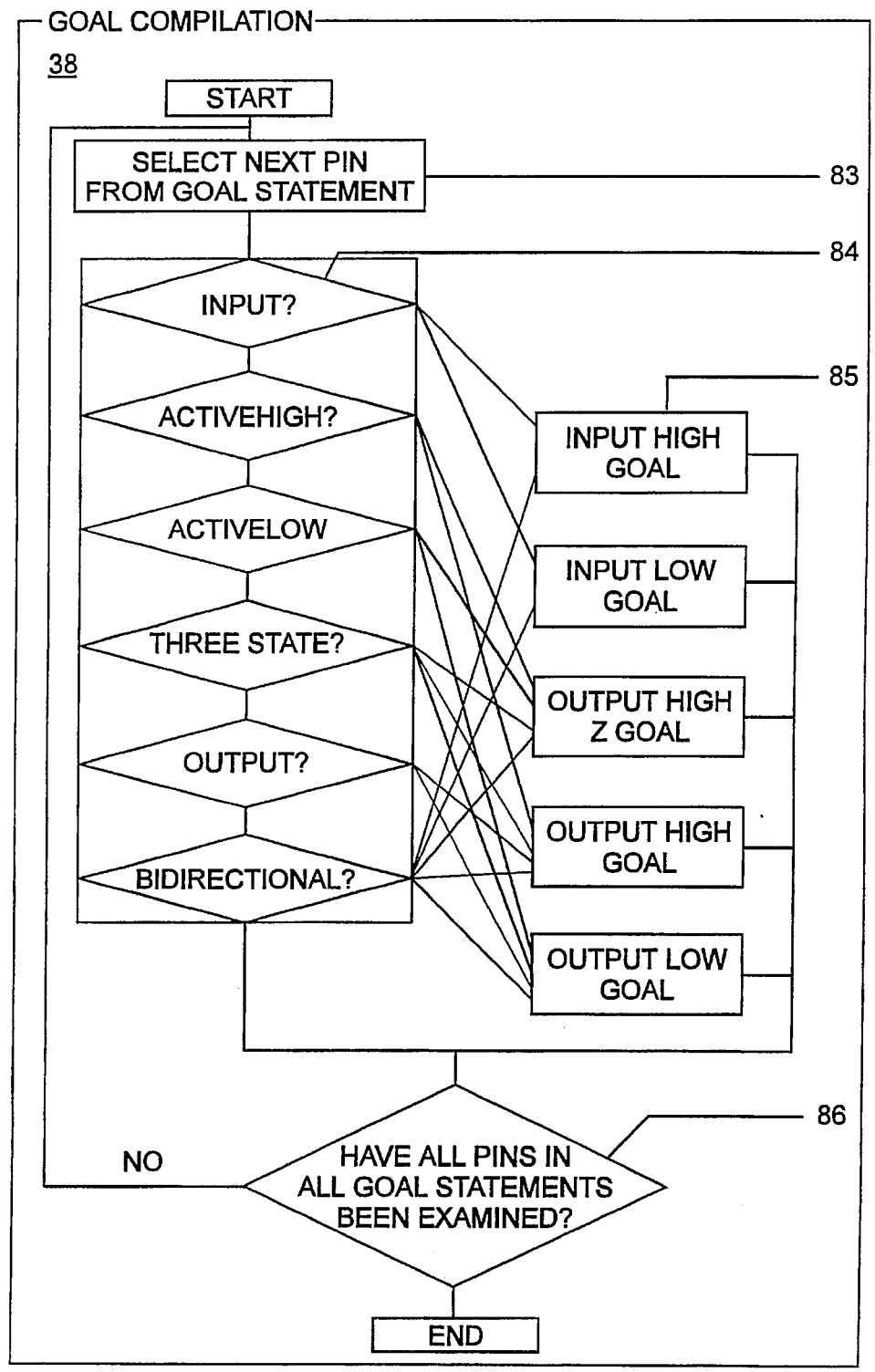
FIG. 7 is a flow-chart illustration of the goal compilation process in which goals are reduced to a compact form for use with the goal searching and minimization procedures of the invention

FIG. 7 illustrates the process of compiling goals to obtain a disciplined internal data structure capable of driving the goal searching and minimization procedures. Each pin referred to in a goal statement is examined and classified as to the goals it requires of the test vector sequence. Examples of goal statements are given in the discussion of FIGS. 17 and 20. The syntax of the "find" portion of the goal statement includes the following keywords and/or structures:

inputs outputs all (list of pins or groups of pins)

state (pins and states)

A "find (all)" statement would result in the compilation of a complete list of all possible goals for all pins of the IC as they were classified in the shell. A "find(outputs)" statement would produce no input goals. A "find(pin name)" statement would produce goals only for the named pin. A "find(state)" statement would cause the seeking of a vector sequence that produces a specific state on a specific pin or group of pins.

The shell itself is discussed in detail in the discussion of FIG. 15. With respect to the discussion of FIG. 7, consider that statements in the shell which collect certain pins into specific categories, each category having a defined legal set of goals, will tell the goal compilation process what goals are legal for each of the IC's pins.

Examining FIG. 7, then, it is seen that the procedure selects 83 a pin from the relevant goal statement and tests in step 84 to see how it is classified in the shell. Each of the six kinds of pins tested in step 84 (input, activehigh, activelow, three state, output and bidirectional) has a particular set of goals associated with it, as shown in the chart. If the pin currently being tested is an input, then its input high and input low goals are entered into the goal list. If it is active high, then output high-Z and output high goals are entered. The goal compilation process terminates step 86 when all pins in the goal statements have been examined and their goals have been listed.

The list of goals thus compiled becomes the list of goals that need to be searched for and satisfied by vector sequences produced by the goal searching procedures to be described below in the discussions of FIGS. 8 and 9. At the time of compilation, the goals are marked as "unsatisfied."

As the goal searching and minimization procedures operate, they satisfy goals, and mark them as "satisfied." Any time the searching or minimizing procedures conclude that the current test vector sequence satisfies a new goal, it is referred to as a "new goal." Once the satisfaction of a goal is approved by the human operator, the satisfied goal is not searched again.

Figure 8:
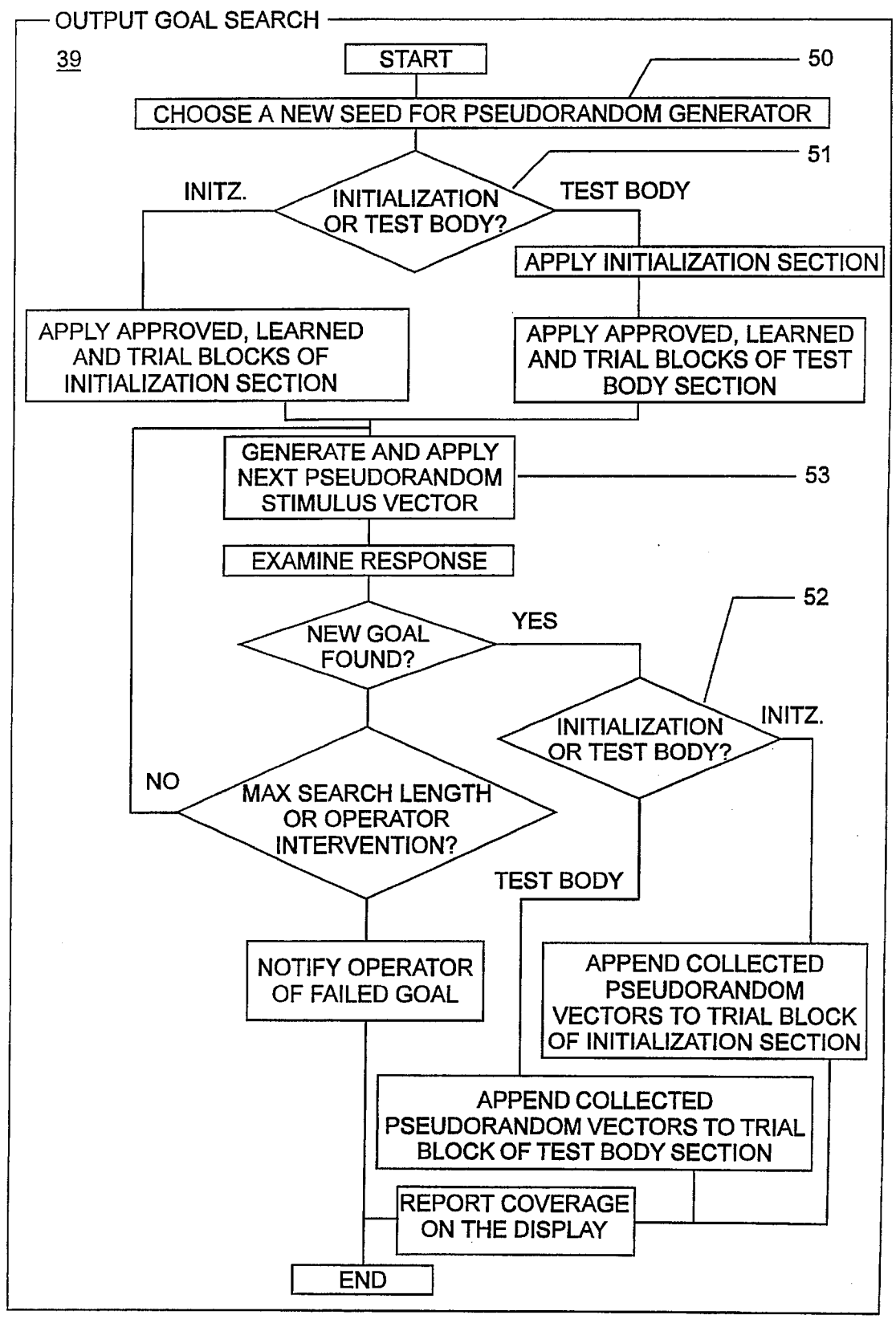
FIG. 8 is a flow-chart illustration of the goal searching procedure for finding vectors that will reveal pin faults on outputs of the sample IC.

FIG. 8 shows in flow chart form the Output Goal Search procedure first seen as step 39 in FIG. 4. To this procedure is assigned the task of generating sequences of vectors which satisfy the output pin fault test goals compiled from shell and goal statements. Its purpose is to append the vectors it creates to a growing list, i.e. to build a trial block of trial vectors that come after the approved and learned blocks. Each successful pass through the goal search procedure satisfies one or more new goals. The total vector sequence preparation process will therefore use the goal search procedure several times, following each use with a minimization 41.

To show the operation of the output goal search procedure, consider the process whereby the procedure finds goals for the test body section 33 of the vector sequence 34. In particular, the operator has previously chosen in choice 48 of setup step 37 to work on the test body section. As the flow chart of FIG. 8 is discussed, therefore, this means that the two "initialization or test body" diamonds 51 and 52 both have "test body" as their outcomes.

The Output Goal Search step 39 proceeds as follows. In step 50, the procedure picks a seed for a random number generator, to be used twice during the procedure. The procedure then tells the hardware unit 2 to drive the sample IC 4 through all six parts of the vector sequence that have already been determined, including all three blocks 26, 27 and 28 of the initialization section 29 and all three blocks 30, 31 and 32 of the test body section 33.

Then, using the seed chosen at step 50, the procedure makes up a new pseudorandom stimulus vector at step 53, and applies it to the IC's inputs. Having done this, it examines the IC's output levels. If any previously unsatisfied output goal is found (for example, if an output that had been low throughout the existing vector sequence went high after this new vector was applied) the goal search loop exits through diamond 52. Otherwise, the procedure must keep on searching, making pseudorandom vectors one at a time and applying them to the IC's inputs until a time limit is exhausted, or the operator intervenes, or until, eventually, a new goal is found.

So, when a new goal is found, the procedure re-creates the vectors that found the goal, and appends them to the trial block. The seed that was used in the pseudorandom number generator to generate the vectors applied to the IC is now recalled. The seed is used to re-create the vectors this second time, writing them to the trial block instead of applying them to the IC's input pins. Alternatively, the vectors could have been stored at first, obviating the need for this re-creation step. Whether they should be generated once and stored, or generated twice is simply a tradeoff for the implementer to make based on the speed and cost of generation vs. the speed and cost of storing, and does not materially change the invention.

A coverage report displayed to the operator is updated. The output goal search procedure returns to the top level flow chart FIG. 4, where a minimization procedure will next be applied. Although the vector sequence in the trial block has satisfied a previously unsatisfied goal, that goal is not yet marked permanently as having been satisfied. The minimization process (see discussion of FIG. 10) may end up satisfying a different new goal than the new goal satisfied by this pass through the goal searching procedure.

As the flow chart indicates, goal searching for the initialization part will work the same general way as for the test body part, but, as determined by decision blocks 51 and 52, will use a different set of goals and will place its results in a different place.

Some remarks about the use of a pseudorandom number generator to generate vectors may be in order here. Pseudorandom number functions are well known. These are provided with all modern software compilers, so a pseudorandom function is essentially built into the software at the time the software is compiled. The microscopic behavior of the pseudorandom function is not of relevance, as long as it produces pseudorandom numbers.

A pseudorandom function, as opposed to a true random function, uses a "seed number." Given the same seed, the pseudorandom function will produce the same series of numbers. If the function is called a large number of times, the numbers will have values that are distributed randomly over some defined range. The human operator, moreover, cannot guess what number will appear next, or in general what sequence will result from a particular seed. The sequence is known to be deterministic, but nobody can reliably guess the next number, and the numbers as an aggregate will have the same distribution as random numbers. These properties define a "pseudorandom" function.

Every vector event produced by the goal searching procedures in the preferred embodiment comprises one of the following: a single stimulus state change applied to one IC input; a pulse (or random number of pulses) applied to any pin defined in the shell as a "clock"; or the invocation of a "cycle," as defined in the shell. (See the discussion of the shell and of clocks and cycles in the discussion of FIG. 15 for more information about these constructs.)

Accordingly, the invention maintains three lists of "things to try next." First, a list of pins that can have their stimulus state changed without interfering with a cycle invocation; second, a list of clock pins that can be pulsed or driven with single edges; third, a list of cycles that can be invoked. Taken together, these three lists form an aggregate list of possible things that can be tried next. As the procedure creates each new vector, it calls the seeded pseudorandom function in the software and uses the resulting pseudorandom number to randomly select one item from among the three lists of possible things to do. Single pin changes, clock events and cycle events in the trial block are generally referred to as "items." The feature that automatically generates these items is called a "pseudorandom stimulus generator."

Many refinements in the pseudorandom stimulus generator, such as, for example, allowing the operator to assign different probabilities to different possible choices and thereby cause the generator to emphasize particular kinds of stimulus behavior, are possible. It has been found useful to emphasize the production of clock pulses, for example, in deeply sequential IC's, and to emphasize the production of cycles in bus-organized IC's. Details of these refinements are not crucial to the understanding of the invention. Such refinements may easily be undertaken by anyone skilled in the software art without departing from the spirit of our invention.

Pins defined in the shell as participants in cycles are not intended to be changed all by themselves. If a pin is defined in the shell as having a special association with other pins (i.e. in a "cycles" statement) and the keyword "cycles" appears in the associated goal statement, the pseudorandom stimulus generator will not change its state except in its defined context.

Clocks, cycles and simple individual pin changes all appear within the output, being chosen according to the latest number returned by the software's pseudorandom number function and the selection probabilities discussed above. Accordingly, some of the items produced during the goal search procedure are simple vector state changes involving a single stimulus pin change, while others are composites such as clocking events or cycles. The complex composites (clocks and cycles) will retain their integrity throughout the minimization process that follows goal searching and is described in the discussion of FIG. 10.

Note that clock and cycle events cannot be defined with a single pseudorandom number the way simple individual pin changes are defined. A clock event will have one or more complete excursions, so the next number from the software's pseudorandom function is used to decide how many clock pulses are to be generated in a clocking event. A cycle event may be defined as asking for groups of pins to be treated as having a grouped state (e.g. "address" or "data" or other such word). If a cycle defines variables such as address and data, then each time the pseudorandom event generator creates a cycle, it will also arrange for a pseudorandom change in each of the specified grouped states of that cycle. For example, let a "write" cycle be defined as having variable address and data: every time the pseudorandom event generator inserts a copy of this write cycle into the trial block, it will also use a pseudorandom number to make fresh changes in the address and data variables. See the discussion of FIG. 15 for more information.

Pseudorandom changes in cycle variables such as data or address are normally made the same way pseudorandom changes are made in simple individual pin states: each of the bits involved in the value of the variable (i.e. each of the pins involved in the grouped state) is a candidate to be changed; one bit (i.e. one individual pin belonging to the group) may be selected at random, and changed. Alternatively, the entire grouped state may be changed to a new state, the change involving more than one of the pins, and possibly as many as all of the pins, that together make up the grouped state. In this case, the bits that make up the new state of the cycle's variable would simply be bits of the new pseudorandom number. For example if the new pseudorandom number were (hexadecimal) A563 and the cycle variable had only eight bits in it, the new value of the cycle variable would be (hexadecimal) 63, corresponding to the eight least significant bits of the pseudorandom number. There are many ways to handle random numbers. Space permits this document to disclose only one or two ways that have been proven effective. It will be clear to those of ordinary skill in this technology that the specific manner of handling pseudorandom numbers is a detail of implementation, and that many numeric manipulations differing from those disclosed here could easily be chosen without departing from the spirit of the invention.

Figure 9:
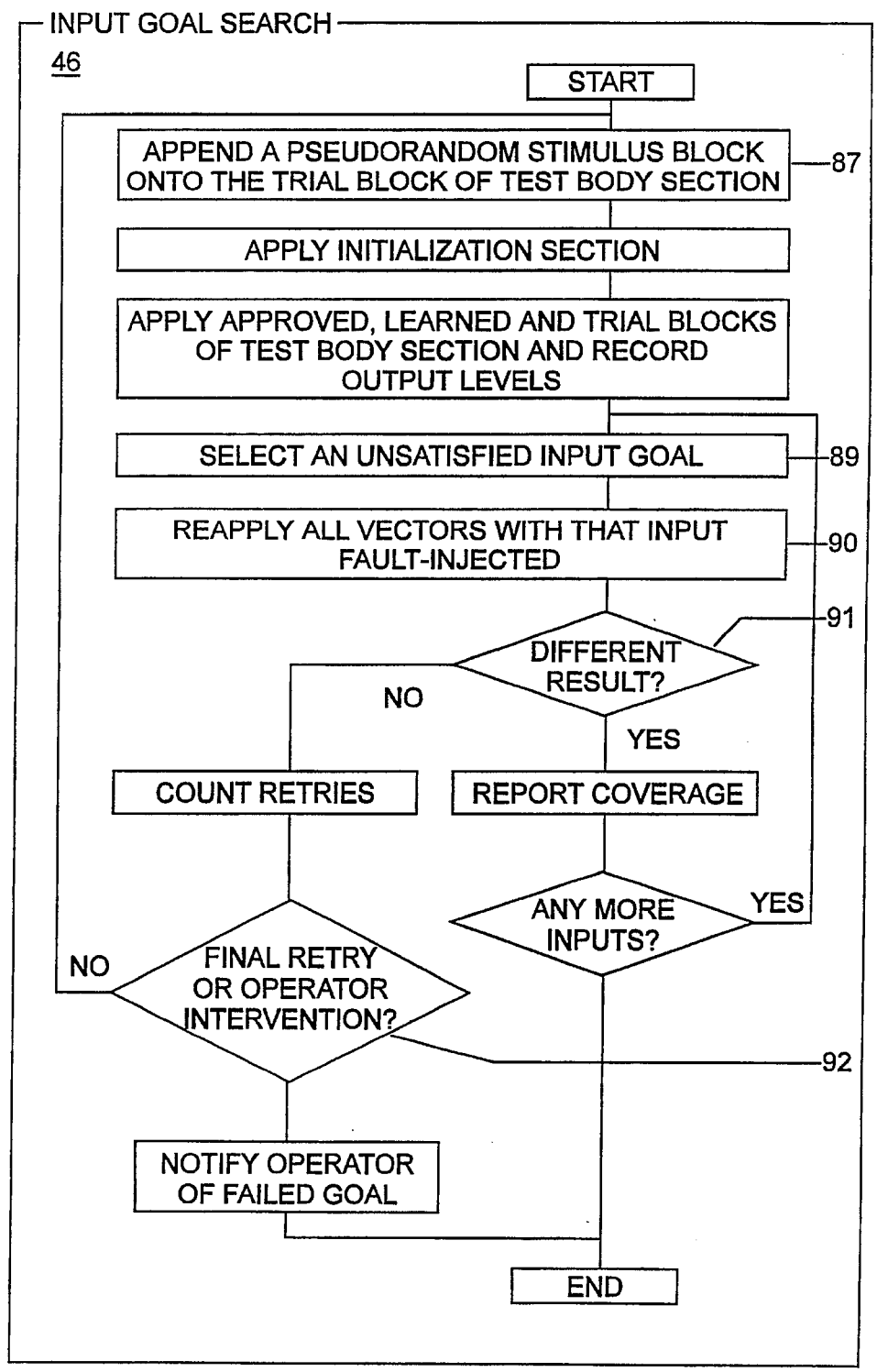
FIG. 9 is a flow-chart illustration of the goal searching procedure for finding vectors that will reveal pin faults on inputs of the sample IC.

FIG. 9 shows in flow chart form the Input Goal Search procedure first noted as step 46 on FIG. 4. There are reasons why the output goal search procedure is designed to be structurally different from the input goal search procedure.

An input fault on a complex IC must be propagated through a sequential system of unknown depth in order to be rendered visible at an output, so more vectors are often needed to satisfy an input goal than to satisfy an output goal.

Also, the input goal search procedure cannot simply observe output behavior to learn whether or not a stimulus sequence has achieved the goal of finding an input fault. Instead, it must use a fault injection technique (as described earlier in this document) to determine whether or not a stimulus sequence has satisfied a goal of being able to propagate evidence of an input fault to an output. Fault injection needs to compare outputs in the "good" state to outputs in the "fault injected" state. Therefore, output levels must also be recorded and checked on a vector by vector basis so that the procedure may decide whether or not the output behaviors have changed as a result of the fault-injecting of an input pin. In the output goal searching procedure, recall that it was not necessary to record output behavior.

An additional difference between input goal search and output goal search is that the initialization section 29 is only for initializing the IC under test and has no true test goals with respect to inputs. The input goal search procedure therefore only works on the trial block 32 of the test body section 33, and does not modify any part of the initialization section 29.

Because of these large differences between output faults and input faults, different goal searching procedures are used for the output goals and the input goals.

Referring to FIG. 9, the first step in the Input Goal Search procedure 46 is to make up a pseudorandom stimulus block and append it in step 87 to the trial block. The seed for this operation will not need to be kept, because the stimulus items themselves will always be kept. The software's random stimulus generator is used in the same way as described earlier, to choose among several equally likely alternatives as to what to do next. At any given point in extending the trial block, the next event choice may be a single pin change, a clock event, or a cycle.

The second step is to stimulate the IC's input pins with vectors from the initialization section 29 and follow up immediately in step 88 with the test body section 33 containing the (newly extended) trial block 32. During the application of the test body vectors, the sample IC's output levels are detected and recorded in memory alongside the stimulus levels.

Then, in step 89, for each input pin having an unsatisfied goal compiled from the pin list and shell, a fault injection is performed in step 90. If the fault injection succeeds in making a detectable difference in at least one output level during at least one vector time, the procedure concludes that the overall stimulus sequence is now capable of revealing a fault on the pin for which fault injection was performed—a new goal has been satisfied. The new goal is noted, and as long as there are more unchecked goals for the vector sequence as it stands in the trial bock, as determined by step 89, the fault injection of step 90 continues, each time with a different input fault injected. In this way the procedure sees whether there might be more than one new goal satisfied.

If no goals were satisfied as determined by step 92, more pseudorandom stimulus items are created and appended in step 87 to those already in the trial block 32 of the test body section 33. Alternatively, and without departing from the spirit of the invention, the entire contents of the trial block may be discarded wholesale, and replaced by a freshly-generated and completely different pseudorandom sequence of stimulus items. A new seed may be used, or a new pseudorandom generator may be substituted. In any case, The fault injection process will be repeated for the changed trial block. Repetition of the search occurs until a time expires, the trial block has grown to consume all available memory, a new goal is found, or the operator intervenes.

On return to the top level FIG. 4, a minimization step 41 will be performed.

Figure 10:
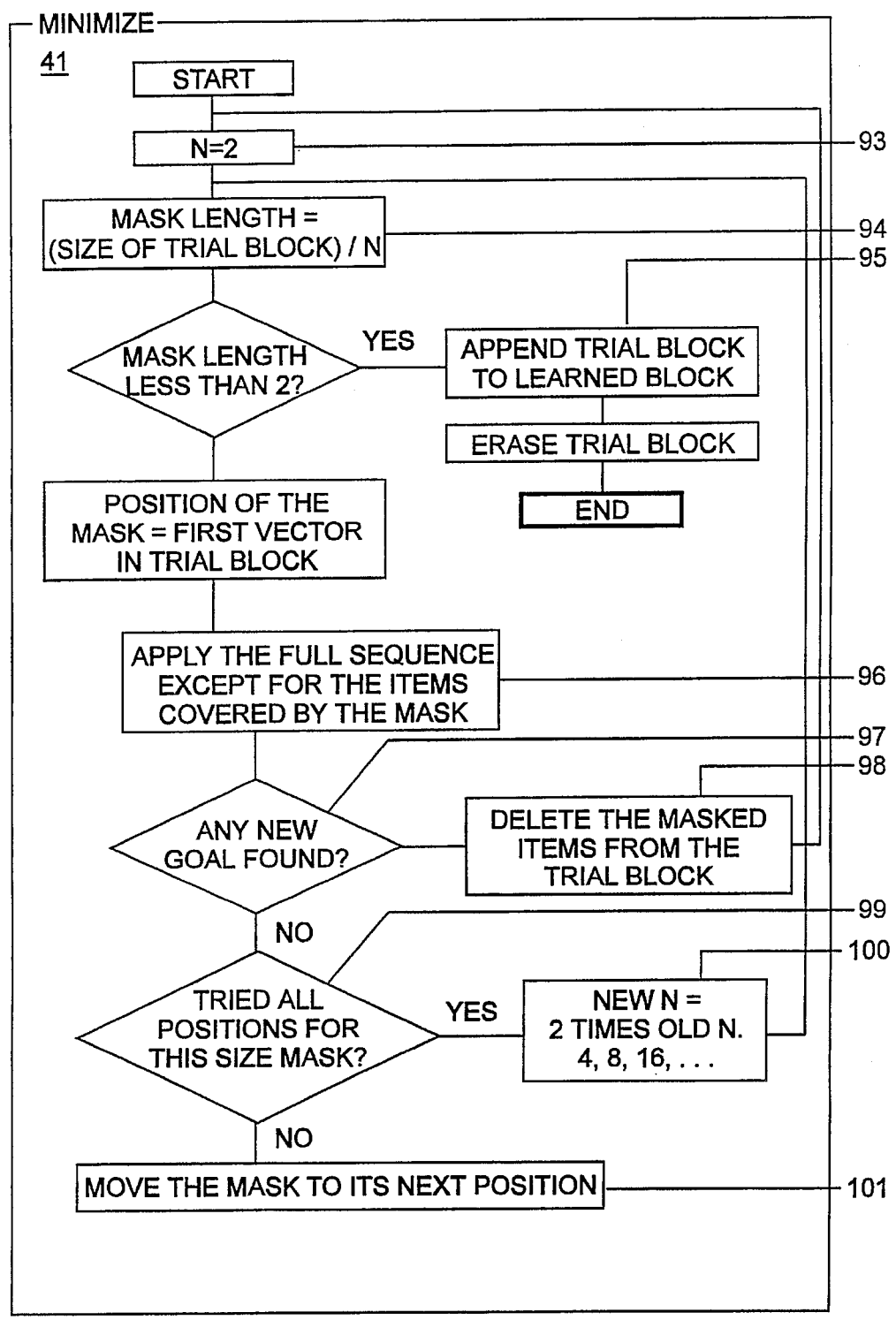
FIG. 10 is a flow-chart illustration of the minimization procedure, which shortens the trial block by discarding unnecessary vectors.

FIG. 10 describes the minimization procedure first noted as step 41 in FIG. 4. The same minimization procedure described here is used after output goal searching 39 and input goal searching 46. The minimization strategy exploits the notion that the part of the trial block most recently added—in particular the final item—must be crucial to finding the new goal that was found. This notion in turn comes from the conjecture that the trial block was allowed to grow at random without being able to satisfy a new goal, until some last stimulus item was added that satisfied a goal. The complementary notion—that some events occurring earlier in the trial block were necessary to set up the conditions that allowed the final stimulus item to find the new goal—is also considered.

The minimizing procedure first defines a "mask" of defined size and position, which inhibits the production of some of the stimulus items in the trial block.

It then applies the mask to the trial block, runs the vector sequence, and tests to see whether new goals are still met by the sequence-as-masked.

Items inhibited by the mask are not simply single pin changes. As the goal searching procedures built the trial block now being minimized, the conceptual integrity of "clock" and "cycle" items was maintained. The integrity of clock and cycle items is maintained throughout the minimization process as well. Thus, a mask will never start or end on a vector in the middle of a clock event or cycle event. It will always either mask all of such an item, or allow it to occur in its entirety.

The methods of testing to see whether goals are met are as previously described, i.e. output activity checking and input fault injection.

The new goal or goals found by the sequence-as-masked need not be the same specific new goal or goals that were discovered by the final stimulus item added to the unmasked sequence: the vectors in the trial block-as-masked still contribute to the fault detection job. They are valuable, even if the contribution made by the sequence-as-masked is entirely different from the contribution of the unmasked sequence. Even a single isolated new contribution is worth keeping, and the procedure is not particular about hanging on to the first contribution it notices, provided some contribution remains.

If the part of the sequence that is not under the mask contributes goals, therefore, the procedure deletes the masked-off part from the trial block. Then the minimization process, including the definition of a new first mask, is repeated afresh with the now-smaller trial block. Remember again that clock and cycle events once put in the test vector sequence are always either kept or deleted in their entireties, and never cut into pieces by the minimization procedure.

If, on the other hand, the trial block-as-masked no longer contributes new goals, the minimization procedure modifies the mask by shortening it and/or moving it to a new position in the trial block. The new-goal test is repeated with this modified (shortened or moved, or both shortened and moved) mask. If the modified mask allows the finding of new goals, the procedure deletes the masked-off items (including single pin changes, clock or cycle events) from the trial block, and the minimization procedure begins afresh.

When masked-off items are deleted in any pass through this loop, the trial block shrinks by the number of deleted items. The next mask, in effect a new first mask, has a size proportional to the size of the newly shrunk trial block, and will of course be shorter than the previous one.

When, on the other hand, the mask inhibits the production of new goals regardless of where the minimization procedure positions it in the trial block, no items are deleted from the trial block. The mask still shrinks, though, because the procedure will choose a smaller mask on its next pass through the trial block in an effort to find something it can delete.

Thus, either way, the mask must shrink as the procedure continues. Accordingly, the procedure uses a test of the mask size as a termination condition. In the preferred embodiment, the minimization procedure terminates when the mask size is one item, it being understood that other termination conditions could be chosen without deviating from the scope or spirit of our invention.

Referring to FIG. 10, in the preferred embodiment, the first mask size (step 93) is half the number of items in the trial block, rounded down if the result is a fraction as determined by step 94. The mask is first positioned at the beginning of the trial block. Again, different formulas could be used to choose the size and position of the first mask without deviating from the scope or spirit of the invention.

If, determined by step 97 the first mask in its first position causes the trial block to stop producing new goals when the sample IC is stimulated (step 96), then the procedure moves the mask to a second position, but does not change the size of the mask. The second position of the first mask is calculated so that the penultimate item of the trial block is the last one masked. For example, if there were 101 items in the trial block numbered 1 to 101, the first mask would be 50 items in size and would cover up items numbered 1 to 50. If this first masking removed the goal-satisfying ability from the trial block, the mask would next be tried in the second half of the trial block, covering items 51 through 100 and not covering item 101. If the trial block, thus masked, is found capable of satisfying any goal or goals, then the procedure will, in step 98, delete items 51 through 100 from the trial block, and repeat the minimization process afresh in step 93.

If the first mask, 50 items deep, interferes with the goal-satisfying ability of the trial block in both positions, the procedure in its preferred embodiment tries a second mask half the size of the first. This mask is smaller, of course and can be tried in more positions. The preferred embodiment will try the one-fourth size mask in as many as four positions, it being understood that a procedure that tried masks of size and position different than those described here would not depart from the scope or spirit of our invention.

The mask after being halved in step 100, is again rounded down if the result is a fraction. Continuing in the example of 101 items, the second mask, having 25 items, is tried. Its first trial position is as before, beginning at item 1 and masking items 1 through 25.

If this second mask in its first position does not interfere with goal finding, the procedure deletes items 1 through 25 from the trial block and repeats the minimization from the very beginning with a trial block now having only 76 items. If the mask of 25 does interfere, however, step 101 moves it to successive positions deeper in the trial block.

Because the second mask is roughly one fourth the size of the trial block, the exemplary embodiment of the minimization procedure will have four possible positions to test it. The fourth and last of these will mask the penultimate item but not mask the last item. The start positions for the 25-item mask in the 101-item example in the preferred embodiment are at item 1, item 26, item 51 and item 76. If the trial block proves effective at finding goals with the mask in any of these four positions, the procedure deletes the 25 masked-off items, leaving 76 items in the trial block. It then begins afresh with a new first mask of 38 items, i.e. half of the 76 items.

If on the other hand, the 25-item mask interfered with goal finding in all of its attempted positions, the mask size is halved again, and rounded down, to 12 items. The procedure in its exemplary embodiment will test this 12-item mask in up to eight positions in the 101-item trial block. This process of: reducing the mask; increasing the number of test positions in the trial block; discarding masked-off items if they don't contribute, and starting over afresh with the trial block reduced continues until the size of the mask is below the termination threshold. In the case of the preferred embodiment, the mask is 100 reduced by half; the number of test positions is 100 doubled, and the termination point occurs when the mask is less than two items.

Note that if the minimization procedure had decided to delete a series of 12 items from the trial block in one of the eight test positions, minimization would have immediately picked up again, against a new trial block of 89 items (101 less 12) and the new first mask would potentially eliminate 44 of them. So the minimization procedure offers multiple opportunities for getting rid of big sections of the trial block, even if its first successful reduction only eliminates a few.

When minimization is complete, the items remaining in the trial block 28 or 32 are appended on step 95 to the associated learned block 27 or 31 respectively, and the trial block is erased for fresh use by the goal searching procedure. The satisfaction of a new goal is noted, and the satisfied new goal is marked so that no further attempts will be made to satisfy it.

In some cases of the exemplary embodiment of the minimization procedure, application of the mask will result in the satisfaction of a "new" new goal, but also cause the abandonment of the "original" new goal whose discovery triggered off the minimization process in the first place. The procedure has thus been distracted from the original new goal in favor of the new goal, and satisfaction of the original new goal has been postponed. The satisfaction of the original new goal is willingly postponed in this embodiment, knowing that it will very likely show up again after several more iterations of the goal searching procedure. It has often been said that a bird in the hand is worth two in the bush, however, and an alternative embodiment of the minimization procedure is described whereby the postponement of the original new goal may sometimes be avoided. This particular bird-in-the-hand variation is depicted in flowchart form as FIG. 22.

Figure 22:
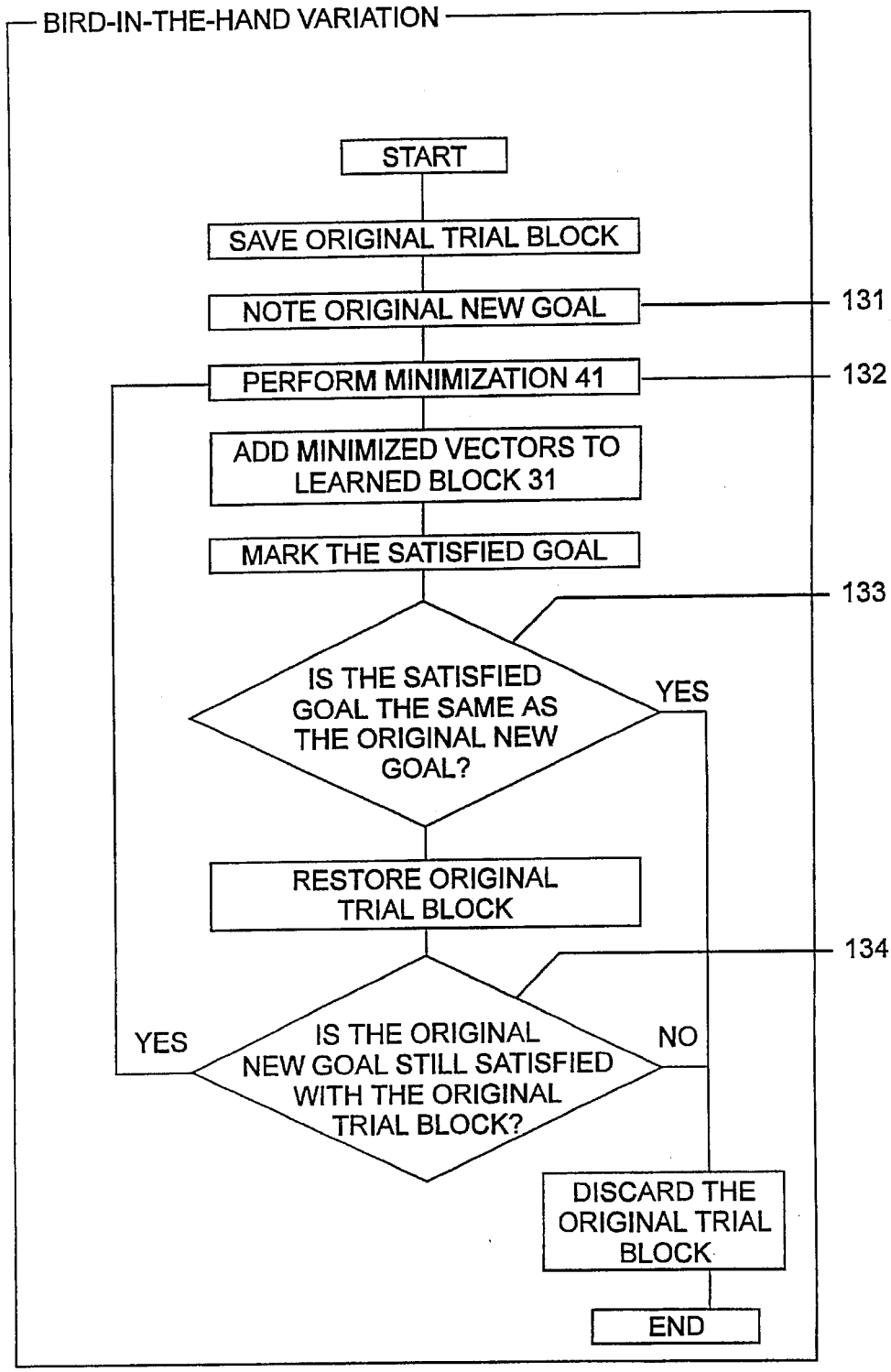
FIG. 22 is the flow chart for the "bird-in-the-hand" variation of the minimizing procedure.

Referring to FIG. 22, this variation involves temporarily filing away the original trial block in its unminimized form, before minimizing the working copy as described above. When the newly minimized trial block is saved into the learned block, the new goal that it satisfied is marked as "satisfied," in step 131. The entire, original, unminimized trial block is now restored and tested to see whether or not it still satisfies the original new goal. If it does, it is simply put through the minimization again in step 132, as described above with reference to FIG. 10. The new goal (the one that was satisfied in the first minimization) cannot distract the minimization procedure from the original new goal again, because the new goal is now in the "satisfied" list. The result of this variation is that a sequence of vectors from the first minimization (those that satisfy the new goal) and a sequence of vectors from the second minimization (those that satisfy the original new goal) will both be kept. Of course, an additional new goal may turn up and again distract the minimization procedure from its original new goal. If that happens, this variation is simply repeated until every distracting new goal is satisfied in turn.

Before the entire unminimized trial block is restored, the learned block will have grown, because the vectors that satisfied the new new goal have been added to it. The learned block is longer, and so constitutes a new starting point for the trial block. As a result, the internal state of the sample IC at the beginning of the trial block may be different from what it was at the time the original new goal was first discovered: the original new goal might possibly be lost anyway. If this happens, the unminimized trial block that was filed away is now useless as determined by step 134: it is discarded, and the process returns to the goal-searching procedure to construct a fresh trial block to follow the new learned block.

Other bird-in-the-hand variations to the minimization process may designed, and may differ from the one described, but which do not materially depart from the spirit of our invention.

Figure 11:
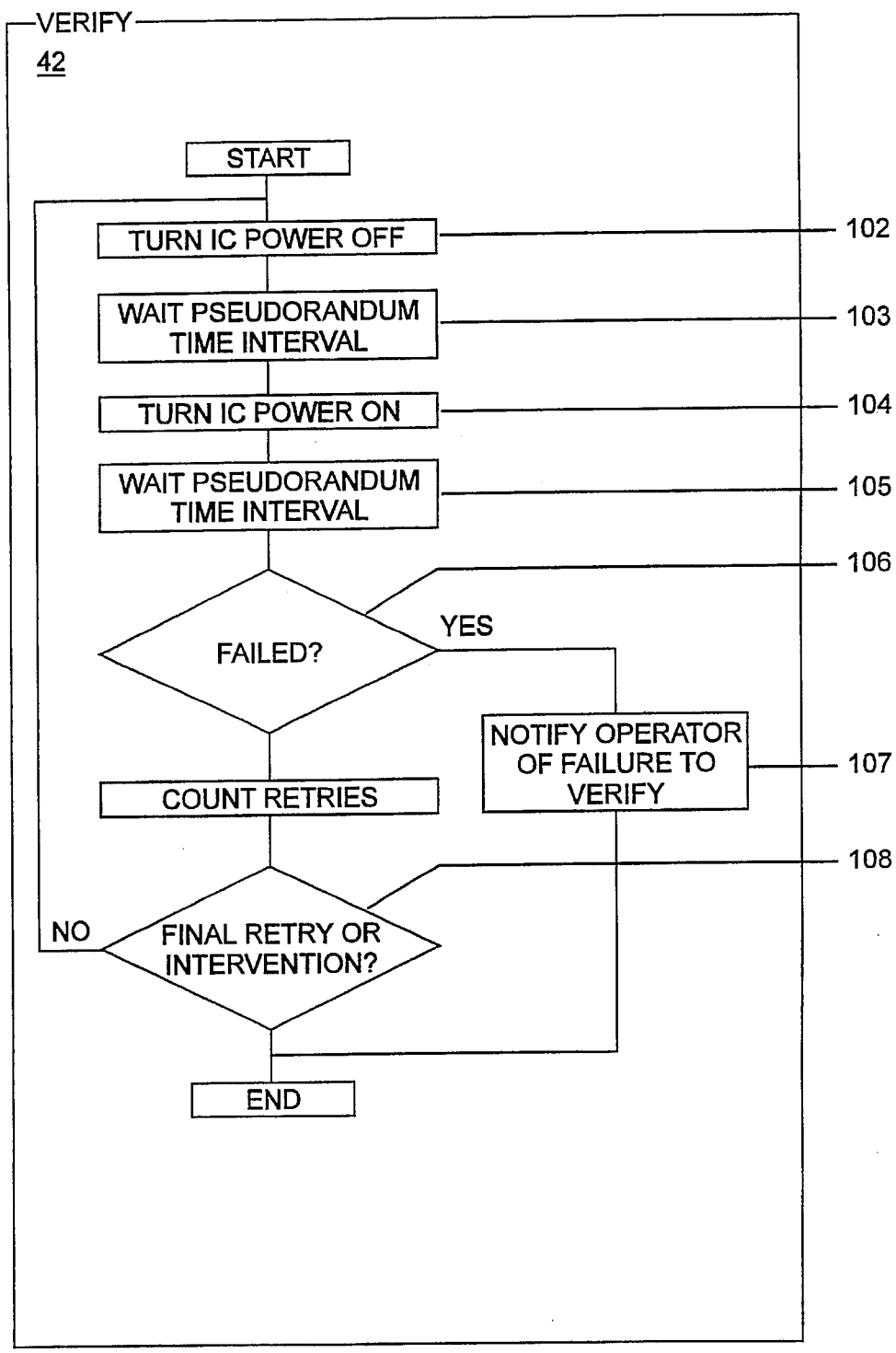
FIG. 11 is a flow-chart illustration of the verification procedure, which tests to see that the sequence works after varying periods removing and reapplying power to the sample IC.

FIG. 11 is a flow-chart illustration of a verification procedure, which tests to see that the sequence works after varying periods (determined by steps 103 and 105) of removing (step 102) and reapplying (step 104) power to the sample IC. This step is one of two the invention uses to verify completeness of the initialization section 29. If, for example, a complex IC performs a lengthy power-on initialization process of its own, unknown to the human operator, the initialization section 29 may behave differently depending on how long power was off and how long it has been on. The verification test shown in flow chart form in FIG. 11 determines whether or not power on and power off times have any effect on the outcome of the test vector sequence as a whole. If a sequence fails to verify (step 106), most likely some additional work is required in the initialization section. The operator is notified in step 107.

This process may be allowed to run unattended for a long period (e.g. overnight) so is provided with an intervention point (step 108) for the operator to terminate it.

Figure 12:
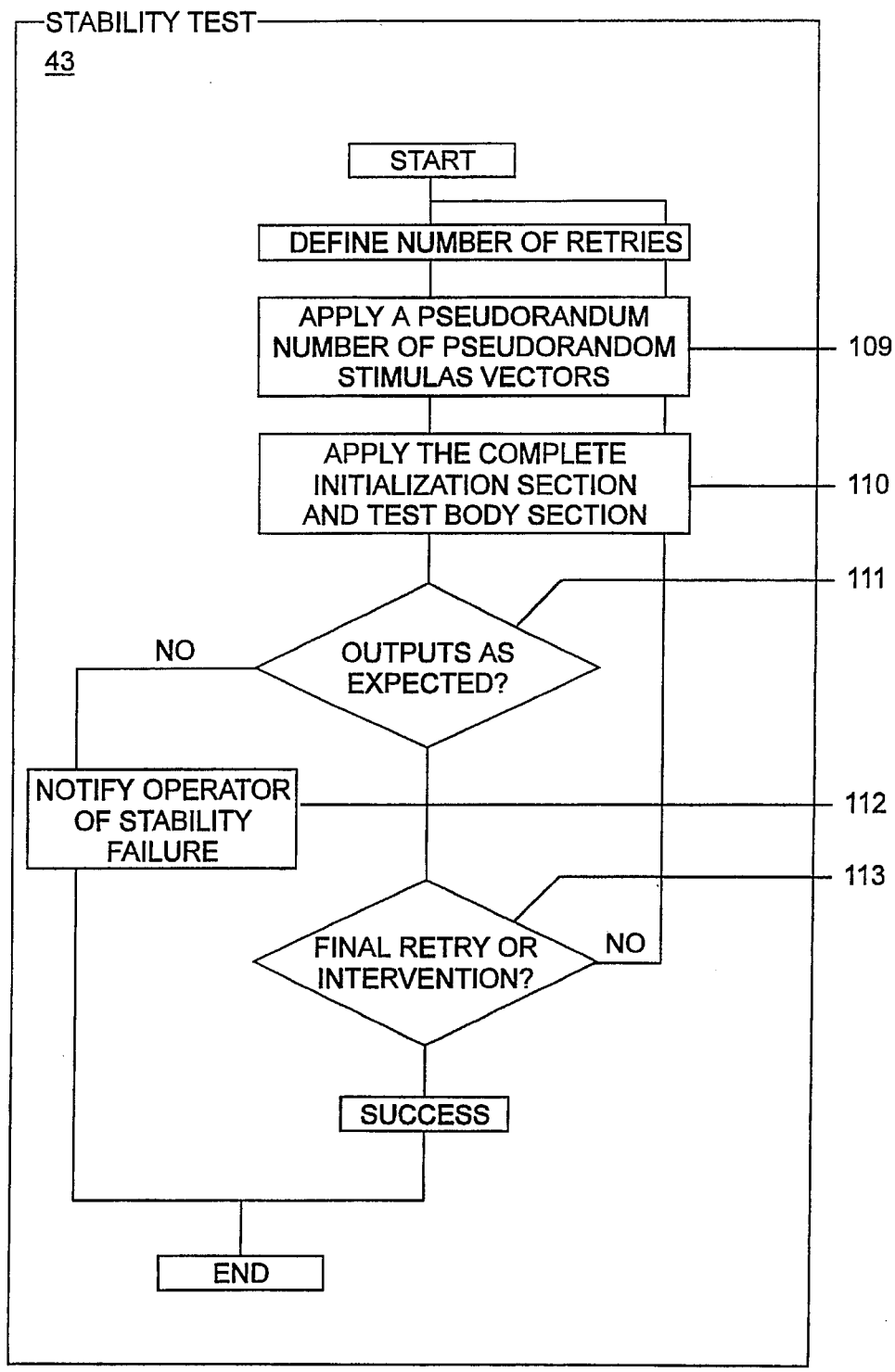
FIG. 12 is a flow-chart illustration of the stability testing procedure which repeatedly perturbs the initial state of the sample IC to make sure the initialization section of the vector sequence can in fact reinitialize it dependably.

FIG. 12 is a flow-chart illustration of a stability testing procedure which repeatedly perturbs the initial state of the sample IC to make sure the initialization section of the vector sequence can in fact reinitialize it dependably. This step is the second of two recommended to verify completeness of the initialization section 29, the first one being the "verify" section described above in the discussion of FIG. 11 above. Instability of the test can have various causes. Perhaps the initialization section is incomplete, in that it cannot recover control of the IC from certain pathological states, but it has always worked so far because the IC has not been in any of those states. Accordingly the stability test seeks to drive the IC into a wide variety of internal states and then let the test vector sequence attempt to test the IC. It applies in step 109, a long series of pseudorandom vectors to the IC's input pins, and then runs, in step 110, the test vector sequence whose stability is in question.

Another stability testing contemplated by the present invention method is to run some fraction of the vectors from the test vector sequence to drive the IC away from its initialized state, and then re-run the entire sequence.

If, as determined by step 111, the vector sequence ever fails to pass an IC whose state we have deliberately disturbed, we can expect PCB's to be falsely rejected in production. As with the verification test, if the stability test fails, most likely more work on the initialization will be needed. The instrument notifies the operator in step 112. As in the verification process described above under the discussion of FIG. 12, the stability test procedure is provided with an operator intervention test (step 113) to terminate it.

FIG. 15 illustrates an example pin list 59 and shell 61. Pin list 59 relates pin names to pin numbers. Shell 62 groups pins of the IC according to their specific purposes in the PCB, such as inputs 62, outputs 63, bidirectional 64 and so forth.

The "cycles" feature allows definition of cycles in which certain pins go through certain activities in prescribed sequences. In the "w" cycle 65, for example, pseudorandom variables "addr" and "data" are called for. These numbers are applied to the pins associated with the pins labeled a[0–9] and d[0–7] respectively. Then the/iow pin is taken low and high again. Finally the channels driving the d[0–7] pins are placed in their high impedance (Z) state.

An "r" cycle 69 is also illustrated, in which an address is presented to the IC and the/ior pin is pulsed.

Note that pins used in cycle definitions will generally be manipulated by the pseudorandom stimulus generator only within the context of a cycle. Were the invention to treat such pins as independent entities as well, the concept of cycles would be impaired. For example, in the w cycle 65, the/iow signal is taken low, then immediately high again. For the cycle concept to succeed, it should be assured that the/iow signal is high at the beginning of each w cycle. The scheduling of the next w cycle is dependent on a pseudorandom number generator, so it cannot be predicted at any given vector time whether or not the next item will be a w cycle. Therefore, it's best simply to keep/iow high from the end of one w cycle to the beginning of the next. Accordingly, the invention avoids making out-of-context changes in the state of pins such as/iow that are used in cycle definitions.

The human operator may override this restriction in two ways: first, the operator may deliberately edit into the approved block a state change on any pin at any point; second, the operator may omit any mention of the keyword "cycles" in the "stim" portion of the "goal" statement. Details of goal statements are discussed in the discussion of FIG. 17 below.

A complete description of the syntax for the pin list and shell follows.

Figure 19:
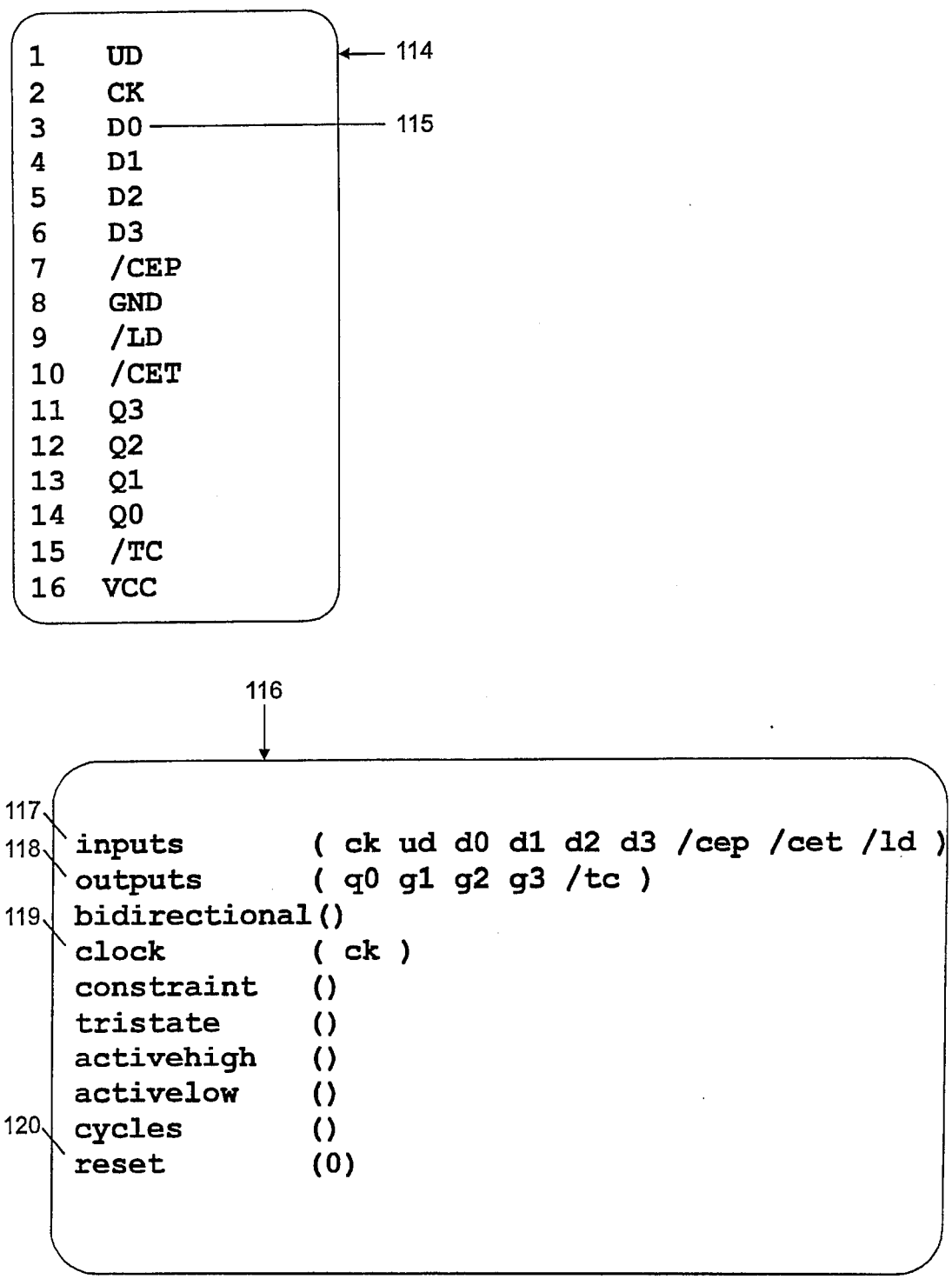
FIG. 19 is a pin list and shell for a second example, the counter chip.

To establish a pin list, make entries of the form channel pin name <cr> where "channel" is a number corresponding to the particular channel circuit (refer also to FIG. 13) attached by the fixture wiring to the IC's pin of name "pin name." example pin lists appear in FIGS. 15 and 19.

To establish a shell, make entries of the form keyword (specification)

where "keyword" is one of the following:
 inputs
 outputs
 bidirectional
 activehigh
 activelow
 tristate
 cycles
 clock
 constraint
 reset and "specification" varies according to the keyword. For the following keywords
 inputs
 outputs
 bidirectional
 activehigh
 activelow
 tristate "specification" includes lists of names of the pins on the sample IC that belong to the category defined by the keyword. A list takes the form of individual pin names separated by spaces or commas; in addition it may specify a group name for a group of pins. In any case, the pin names must have previously been mentioned in the pin list. An example of this kind of specification appears as item 62 in FIG. 15.

In addition, the keywords
 cycles
 clock
 constraint
 reset specify certain limitations on the behavior of the pseudorandom stimulus generator with respect to the pins listed after those keywords. "Cycles," as noted above, defines a specific protocol for using certain pins. "Clock" defines a pin that often needs to be given complete pulses, but may also get single transitions. Single transitions can be excluded in the stim portion of the goal statement—see the explanation of FIG. 17 for more information. "Constraint" indicates that certain pins on the sample IC are to be treated as though tied (constrained) high or tied low in order to behave as they will when the IC is soldered to the PCB under test. "Reset" defines the reset condition of the hardware unit, i.e. the starting condition for all pins on the sample IC before the vector sequence begins to run.

The w cycle 65 of FIG. 15 describes a number of things that will happen when the w cycle is inserted into the test vector sequence.

First, two pseudorandom variables, addr and data, are defined as formal parameters. These two variables will be manipulated in a pseudorandom way each time the w cycle is automatically inserted into the test vector sequence. They may also be set by the human operator if the operator chooses to edit a w cycle into the test vector sequence, i.e. if the human operator thought it essential to write certain data at a certain address in the IC at a certain time, the operator could use a w cycle to perform the task. This will be discussed in more detail in the discussion of FIG. 17.

The line beginning with the % sign is a comment for the human reader and has no machine-related functions.

Second, "out (addr a[0–9])" instructs the invention to assert the bits of the current value of the variable addr as logic high and low levels on the channels associated with a0, a1, . . . with a0 assuming the state of the least significant bit of the variable addr. For example if addr were (hexadecimal) 143, then a0, a1, a6 and a8 would be high, and a2, a3, a4, a5, a7 and a9 would be low. In the w cycle definition, the formal parameter addr is used. If the cycle is inserted by the pseudorandom method during the goal procedure, addr will have a pseudorandom value assigned at the point of insertion.

Third, "out (data d[0–7])" works in a way similar to the "out addr . . . " statement described above, but on a different set of pins.

Fourth, the next two lines in the definition of w cycle 65 l(/iow)

h(/iow)

cause the signal/iow to be taken low from its high resting state, and then returned to its high resting state.

Fifth, the last statement in the w cycle z(d[0–7])

instructs the invention to render its channel drivers "high-Z" and thus stop asserting signals on the channels connected to the sample IC's d0, d1, d3 . . . d7 pins. This is done to allow the sample IC to emit data on those pins during events following the w cycle. One such event is the r cycle 69, whose definition follows immediately in this shell.

Note the pins "a[0–9]" d[0–9]" and "/iow" are defined in the "inputs" statement 62.

The statement clock (osc)

in shell definition 61 of FIG. 15 instructs the invention to treat the "osc" pin of the sample IC as a clock input. Note that the osc pin needs to be included in the "inputs" statement 62 as well. The pseudorandom stimulus generator can produce trains of pulses on a clock pin, and also produce single edges. This behavior may be regulated further by the stim portion of the "goal" statement—see the discussion of FIG. 17 for additional information.

Figure 16:
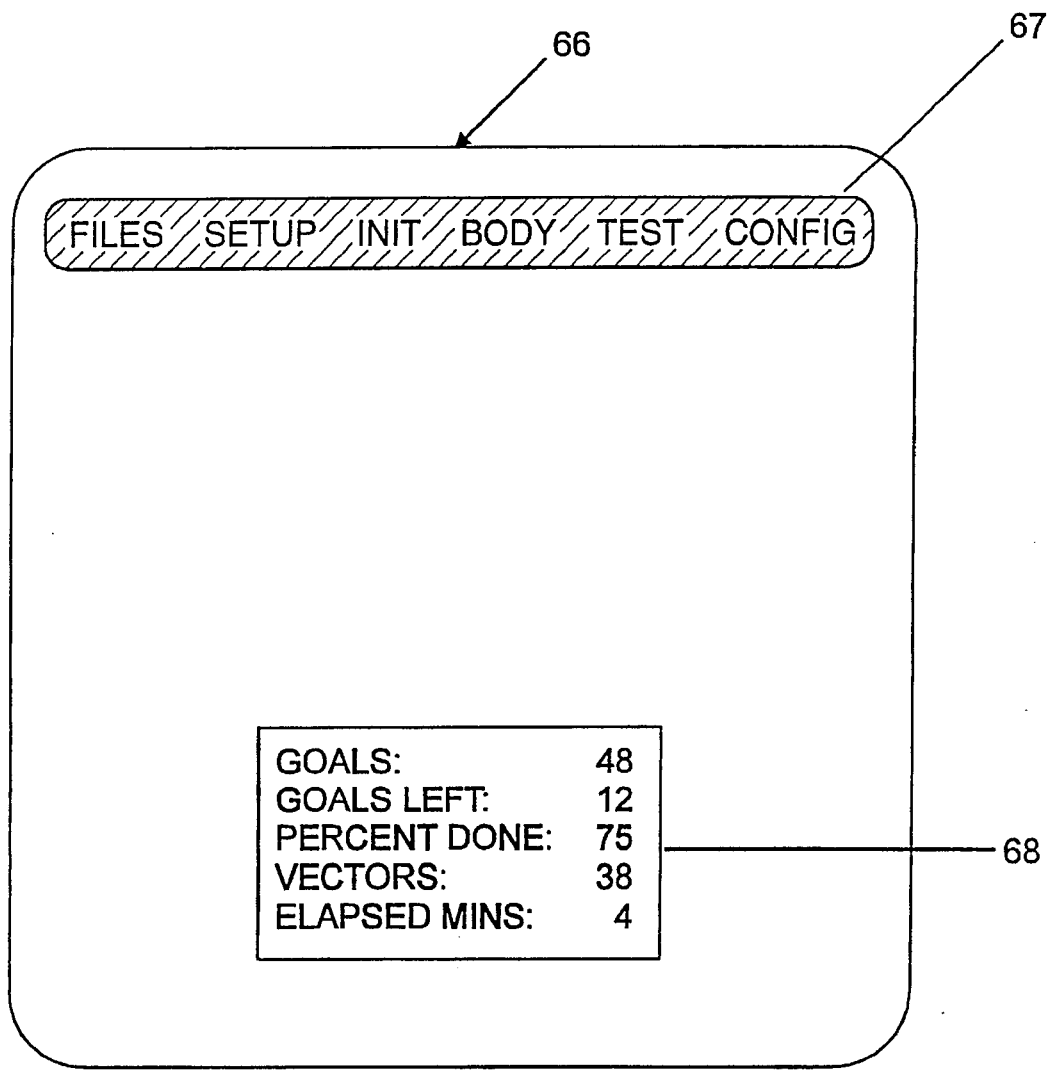
FIG. 16 is a coverage report that appears on the computer display during the running of the goal searching procedures of the invention and at other times as needed.

FIG. 16 is a representation of a CRT screen 66 of computer 1 with menu bar 67 as are well known in the art. An on-line coverage report 68 is shown on the CRT during the time the goal searching and minimization procedures are operating. The operator may use this information to make informed decisions about whether to allow the process to continue, or whether to intervene, change some setup information and resume.

FIG. 17 shows vector sequences and goals in the internal language of the software of the invention. The two separate text blocks shown in FIG. 17 reflect the contents of the approved block 26 of initialization section 29 and the approved block 30 of the test body section 33.

The vector language syntax is simple, and is explained below. It is a stimulus-only language, and does not define expected responses.

The keyword h (or H—upper and lower case are equivalent in the invention's language) followed by a list of pins instructs the invention to set the stimulus channel drivers high for the channels corresponding to the indicated named pins. The h(/ior/iow) statement 71 sets IC pins/ior and/iow high. The keyword L in an l (or L) statement sets the associated pins low, e.g. the l(reset)

statement 72 sets the IC's reset pin low.

A cycle is invoked simply by entering its name, followed by real numbers in place of the formal parameters used in the cycle definition. Thus where a w cycle 65 (Ref. FIG. 15) requires addr and data as formal parameters, the w($23C 0)

statement 73 provides the value $23C for addr and 0 for data, and causes the machine to provide a complex sequence of stimulation to the sample IC.

A P statement supplies a number of complete pulses (i.e. an even number of transitions) to only one pin. A P statement such as the p(26,osc)

statement produces 26 transitions (13 pulses) on the IC's osc input pin. It would be possible for the operator to initialize the state of the osc pin at the beginning of the sequence by editing in an H or L statement. The initial level on the clock pins is also affected by the "reset" directive, which establishes the beginning states of all the stimulus channels.

In each text block, the human operator may edit items into the vector sequence, and may edit the goal statement. The goal statement for each block is at the end of the block, and the vector items are at the beginning. The vector items for the init block are enclosed in the parentheses of the "init" statement. The vector items for the test body block are enclosed in the parentheses of the "test" statement.

The initialization and test body blocks have separate goal statements, because initialization and test body have different goals. Look first at the goal statement for initialization. By means of the "find" portion of the goal statement of this case, the invention was directed to automatically create a stimulus sequence capable of bringing the eight data pins d[0–7] to a high-Z state and the/gamew and/gamer outputs to the high state. The automatic stimulus generator's activities are controlled by means of the declarations inside the parentheses of the "stim" portion of the goal statement to use all available "inputs" and "cycles," but because of the "!reset" declaration, not to make any changes on the reset pin.

In the example of FIG. 17, the operator has noticed the reset pin of the IC, and decided to give the process a head start by editing some initial vector items into the beginning of the vector sequence. The first item 71 establishes high stimulus levels on/ior and/iow. The second item applies a high stimulus level on the reset pin. The third item 72 applies a low stimulus level on the reset pin. Because of the "!reset" declaration in the initialization goal statement, the pseudorandom generator will not disturb the reset pin any more during initialization.

The operator has also deliberately written zeroes in three internal registers of the IC using w cycles. From that point on, the goal searching and minimization procedures described above were allowed to work until the requested goals were stably attained. Five lines beginning with the R($3E3E) cycle 74 were added automatically in a process that took a few minutes. Thousands of vectors were created, then minimized down to these five, which were then appended to the approved block.

Once items are added to the approved block, the minimization process can no longer remove them (although they may be removed by hand editing if so desired). Therefore, if it becomes necessary at any time to change or add any initialization goals, the operator may easily modify the goal statement, and repeat the goal search procedure. This adds vectors to the vector sequence without disturbing any of the work that had already been accumulated.

The test body fits in the parentheses following the word "test" 77. As in the initialization section discussed immediately above, the vector items seen in this block are the "approved block." The block may be edited by hand, or extended automatically by adding goals to the goal statement 76 and repeating the automatic goal search process. Events discovered by successive goal searches and minimizations are appended after the last approved event, so work already done is never disturbed.

The goal statement 76 here states find (all)

stim (inputs cycles !reset)

Finding "all" goals means simply all input and output goals appropriate to the kinds of pins that have been declared. As discussed in the section on FIG. 7 (goal compilation) different kinds of pins have different kinds of goals. Making reference to FIG. 4, it is seen that it is desirable to find the output goals first, then the input goals. In any case, the process is automatic, comprising repeated goal searches and minimizations, typically resulting in a very small number of items with others having been discarded during minimization.

The stim portion of the goal statement guides the stimulus generator. In this case, stim (inputs cycles !reset)

tells the stimulus generator it can drive all individual input pins on the sample IC, but that inputs belonging to "cycles" definitions must be treated in the context only of the cycles which make reference to them. Clock contexts are not included in the "cycles" declaration, so the osc pin will possibly be driven as a single pin, in addition to being given trains of pulses in the context of a "p" construct. Single-edge treatment of the osc pin in this case could be prevented by rewriting the stim portion of this goal statement as stim (inputs cycles clocks !reset !osc)

The !osc notation would instruct the pseudorandom stimulus generator to avoid making single edge changes on the osc pin, the "clocks" keyword would instruct it to generate "p" items that cause full pulses on the osc pin. The test body stimulus program 77 in fact includes a line establishing an initial high state on the osc pin, and several "p" items that cause multiple full pulses on the osc pin.

The !reset declaration tells the stimulus generator not to produce any activity on the reset pin. Random activity on the reset pin, because the reset pin has power over many IC functions, would possibly impede the finding of other goals, the human operator has used the "stim" feature to exclude it from the list of pins under the control of the automatic pseudorandom stimulus generator.

As noted earlier, the goal statement and the vector sequence may both be edited at any time, and automatic action resumed. Near the end of the vector sequence there is a h(RESET)

statement. This of course is inconsistent with the !reset declaration in the stim part of the goal statement 76. It cannot have been put there by the pseudorandom stimulus generator, so must have been added by the human operator. The operator would have been told repeatedly by the goal search procedure's status report that the vector sequence was incapable of detecting a high on the reset input. Thus, after all other goals had been found, the operator edited in the h(RESET) statement by hand, and resumed the goal search process. The goal search process had to perform one more R cycle following the reset operation to ascertain that the input high goal on the reset pin had now been satisfied, proving that the test vector sequence now has the capability of detecting a static fault on the RESET pin itself.

This discussion should indicate to one of skill in this technology that the invention is not fully autonomous, but instead provides an enormous amplification to the work of the operator. With a small amount of guidance, a great deal of difficult work was accomplished very quickly. A task that could have taken weeks was reduced to minutes.

FIG. 18 shows one output of the tool—a complete test vector sequence (except for those items omitted for space saving reasons and replaced by ellipsis) in a form ready for use by a popular in-circuit ATE. The ATE in this case is a Teradyne Z1800VP brand in-circuit ATE, and the form shown here is called the "Z18xx ASCII Vector Format." It comprises of a list of pins and functions 78, followed by a set of vectors 79.

Commentary produced by the translation software in the invention identifies an "initialization" section 80 and a "Test body" section 81. Individual vectors are numbered in the commentary at the right-hand margin, as are the terms "W" and "R" which correspond to the "w" and "r" cycles defined as items 65 and 69 of FIG. 15.

The Ascii Vector Format does not provide a way to express clock and cycle items as single lines, so each of those complex items is expanded into a long series of lines. Also, in the Ascii Vector Format, every line must express the state of every pin whether or not it has changed from the previous line. The language of the invention assumes nothing changes except what is called for in each item. There are, in the language of the invention, 12 items in the initialization section and 52 items in the test body, for a total of 62 lines. Item 82 points out the 286th and last vector in the test vector sequence, indicating the much greater compactness of the language of the invention.

The Ascii Vector Format file does contain information which is not in the internal language of the invention, however: the language of the invention contains only stimulus information, but the Ascii Vector Format must carry both stimulus information (H, L, Z) and "expected response" information (U, D, X) to the in-circuit ATE.

The expected response information is acquired from the sample IC in the course of developing the stimulus sequence, and stored in memory. (This fact was mentioned in the discussion of input fault injection above). The responses acquired from the sample IC are converted to the U, D, X states called for in the Ascii Vector Format file accompanying the H, L, Z states derived from translating the stimulus items.

The invention does provide an oscilloscope-style display to show the acquired responses to the operator on demand, but does not express the "expected response" in a language form. There is no need for the operator to edit the expected response, so no need for a language. After all, the sample IC, not the operator, is the ultimate authority as to what the IC's outputs should be at any given time.

As a potent demonstration of the power of the invention to reduce the labor of the human operator, note that the chip in the example of FIG. 18 has 39 pins of interest. The test vector sequence covers static faults on 100 percent or them. Yet, aside from initially entering their names, very little attention was placed on most of them. The only ones requiring any mental focus at all were/ior/iow d[0–7] a[0–9] osc and reset. The remaining pins were dealt with automatically by the invention, without overt mention by the operator.

The file containing the text of FIG. 18 may be carried from the invention to the ATE by any effective means. In FIG. 1 a floppy disk 5 is suggested for this purpose, but anyone skilled in the art will recognize that other media, or even a network, could just as easily be used to move the information from one place to another. In some cases, the computer 1 may also be the computer that controls the ATE, so the file will not need to be moved.

The example shown in FIG. 18 is taken from an actual run performed on an actual IC. Very little was known about this IC to begin with, yet the invention was used to speedily create a complete sequence of in-circuit test vectors. Because the true functions of the IC in this first example is completely unknown to the reader (indeed, it's unknown to the inventors), a second example follows in which the invention is used to develop test vectors for a simple counter IC.

FIG. 23 depicts a counter, which has nine inputs and five outputs. This simple counter is clocked by the CK pin 135, 136. It can be loaded if the/LD pin is taken low (this action may or may not require a clock pulse—and knowledge is not required in advance, as the invention will generate an effective stimulus sequence either way). It has two enabling pins/CEP and/CET (again, no details need be supplied). It has an up/down control to control the count direction (which direction is which is not important). It has four data inputs for preloading the four data outputs. The/TC pin corresponds to the "carry" function. Output Q0 137, 138 is the least significant bit of the 4-bit count.

FIG. 19 depicts the pin list 114 and shell 116 for the counter. The pin list simply gives the name of each pin, for example, pin 3 is connected to DO 115. The shell 116 tells the invention which pins are inputs 117 and which are outputs 118. The CK pin is mentioned here as a clock 119, and this mention will eventually enable the pseudorandom stimulus generator to generate "p" events on the CK pin as well as individual single edges. The "reset(0)" declaration 120 tells the invention to start all stimuli at zero prior to the first item in the initialization section.

Figure 20A:
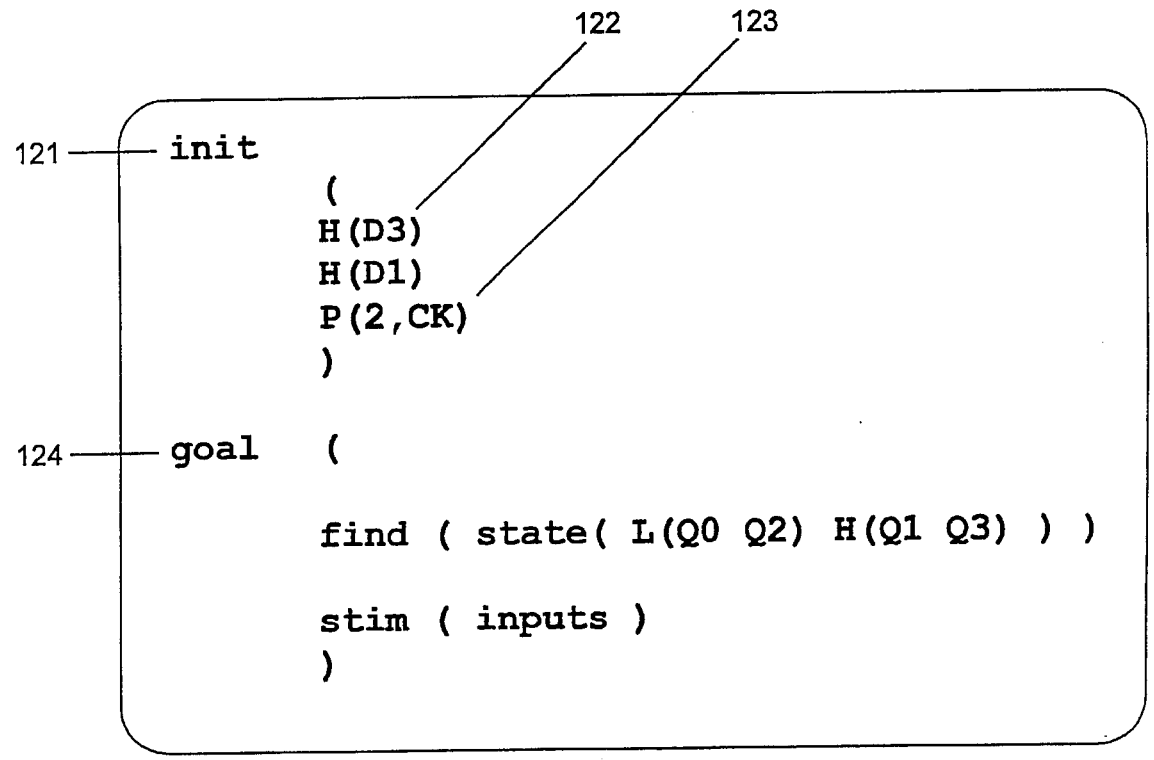
FIG. 20 is a vector items and goal statements for the second example.

FIG. 20 depicts the goals and resulting vectors for the initialization 121 and test body 125 sections. The initialization goal statement 124 find (state (L (q0 q2) H (q1 q3)))

requests the invention to create pseudorandom vectors that set the counter's outputs to a state equal to (hexadecimal) "A," i.e. q0 low, q1 high, q2 low, q3 high. The tools given it to do this work are stim (inputs)

i.e. all the input pins. The complete syntax description of the goal statement is given in the discussion of FIG. 7.

Within a few seconds the invention searched and found the initialization goal, and minimized the resulting list of items to produce the lines shown. Remember the shell defined a reset state of (0), so all stimulus drivers not explicitly taken high remain low. The first two items set high levels on D3 and D1. The third item issues a clock pulse on CK having two edges. The LD input is unspecified, so of course has remained in the low state. The result is that the IC reliably attains the state of (hexadecimal) "A" every time this sequence runs, and the requested find—state goal is satisfied.

Next attention is turned to the goal statement 126 in the test body section 125, which simply says find (all)

stim (inputs)

This goal asks the invention to search for and satisfy all output and input goals (i.e. output high, output low on all output pins, input high and input low on all input pins) and to stimulate all inputs as needed. The stim portion does not mention clocks, and does not exclude single edges on the CK pin, so the resulting stimulus program applies both single edges 140 and complete pulses 139 to the CK pin In short, there are 28 goals: 10 output goals representing two goals for each of five outputs, and 18 input goals representing two goals each for the nine inputs.

Within a few minutes, the invention generated enough pseudorandom items (and minimized them down to a manageable few) to efficiently satisfy all these goals. The useful items, i.e. those remaining after minimization, appear in the test body section.

FIG. 21 shows the full Z18xx Ascii Vector Format file that results from this exercise after translation. It comprises the translated pin list 127, the initialization vector sequence 128, and the test body sequence 129, plus associated commentary.

Consider that a great many custom IC's for which manual creation of test vector sequences is difficult are actually not much more complex than this counter. For example, Programmable Array Logic (PAL) or Generic Array Logic (GAL) chips, which are used in great profusion in the design of modern logic PCB's. PAL and GAL chips have only a few flipflops, so are usually not deeply sequential. Every single one of them is a new design, though, so every single one needs a special test vector sequence.

Consider also that the counter IC in the second example might have been synthesized from a GAL chip. If the GAL chip was seen on a PCB, it would not have been recognized immediately as a counter. If a test vector sequence for it had been written by hand, several hours, or as much as a week would have been required to create a test vector sequence.

But instead, given the present invention, and the human ability to notice from the PCB schematic which pins are input, output and clock, a fully comprehensive in-circuit test vector sequence was created in under five minutes.

The invention makes an immensely valuable contribution to the test vector development process. It speedily solves chips that are known to have baffled human programmers. The chips the invention cannot yet fathom, and the pin faults the invention fails to cover on the chips it does fathom would be likely to baffle a human programmer as well. Inherent mathematical incompleteness, therefore, does not stop the invention from finding of faults that would otherwise escape the attention of the in-circuit ATE.

In the preferred embodiment, the disclosed procedures are written in software and are running in the RAM of computer 1. Alternatively, and without departing from the spirit of our invention, these procedures could be executed by other kinds of machinery, for example, by reprogrammable logic arrays or by embedded processors addressing memories containing software or upgradable firmware within the hardware unit 2.

The application of the procedures of the invention is not limited to individual IC's, but instead may be applied to clusters of two or more IC's and possibly other components. Such clusters may be multi-chip modules, subsections of PCB's, or even whole PCB's. In some cases some or all of the internal circuit nodes of a cluster may be considered "pins of an IC" for purposes of treatment by the invention. It is further recognized that the fault coverage of a cluster test is limited to the fault coverage that would be obtained if the cluster were in fact an IC.

The Institute of Electrical and Electronic Engineers (IEEE) publishes a number of standards on testability, for example one called IEEE 1149.1—Test Access Port and Boundary Scan Logic. This standard provides a group of standardized pins with standardized functions on an IC for the purpose of giving controllability and observability to all normal input and output pins on the IC. The functions of these pins are well defined and disciplined. Rather than generate stimuli at random, the invention may be driven by an appropriate set of procedures optimized for learning the register lengths, outputs, inputs and signal paths through boundary scan chips.

PAL and GAL technologies mentioned earlier have an internal discipline as well, in that they are built on standard blanks. It may be easy to provide starter setups for these IC's, including pin definitions and goal statements. The vectors the invention produces for each implementation will vary according to the way the designer has programmed the IC, of course, but steps may be taken to minimize the time the operator has to spend to get the invention to produce them.

In the preferred embodiment, the voltages for logic levels in the hardware unit's channels are set to properly drive inputs of and receive output levels from ordinary 5-volt CMOS IC's. It is understood that other logic technologies such as ECL, FTTL, 3-volt and 3.3-volt CMOS, etc. exist in the world, and further understood that a version of the invention could easily be built with voltage levels to properly service IC's of these other technologies without departing from the spirit of the invention.

The invention's hardware unit in the preferred embodiment operates as a settled-state machine, in that several hundred nanoseconds generally elapse between one event and the next, and in that the hardware unit makes no specific attempt to regulate this timing precisely. Simply put, the present hardware unit is fast enough for most purposes. Most complex custom IC's today are made using static technologies such as Complementary Metal-Oxide-Semiconductor (generally known as CMOS) or Bipolar-CMOS (BiCMOS). IC's made with such static technologies retain their internal states even when all inputs (including clocks) are held in unchanging conditions for long periods of time. Therefore, the present hardware unit works very well with most of today's complex custom IC's. Some IC's, though, notably LSI microprocessors, are made using "dynamic" technologies such as N-channel Metal-Oxide-Semiconductor ("NMOS"). IC's made with NMOS, NMOS variants, or other dynamic technologies do not always operate reliably if clocked with slow or irregular clocks. The present embodiment is successful with many NMOS IC's but not with all. A normal future evolution of the invention is envisioned in which speed improvements appear in the hardware unit and in the computer driving it. Those speed improvements will allow the invention to serve some IC's which it presently cannot serve. The invention already serves a great many, if not all, dynamic devices. A mere change in speed in future generations of the apparatus of the invention will allow service of a small number of presently unserved devices, but will not deviate from the spirit of the present invention.

Digital ATE machines typically are constructed of stimulus and response channel circuits similar in function to those described here. It would be a relatively simple implementation of the invention to install the procedures and appropriate supporting software into an ATE machine, rather than use the dedicated hardware unit 2 and computer 1. Many ATE machines lack the high-Z detection circuitry disclosed here, so it will often be necessary to add the high-Z detection circuitry to the ATE while it is being used to prepare test vector sequences. Such circuitry will very likely be contained in the test fixture that is also necessary to connect the sample IC to the ATE channels.

What is claimed is:

1. A method for preparing in-circuit test vectors for an electrical component, comprising:

establishing test goals for each pin of said electrical component;

automatically generating at least one pseudorandom test vector;

applying each of said at least one test vector to said electrical component; and after application of each of said at least one test vector, testing whether any of said test goals have been satisfied, and if so, storing said at least one test vector as a set of learned test vectors, and if not, repeating said generating, applying and testing steps.

2. The method of claim 1, further comprising, stopping the automatic generation of test vectors if it is determined that no test goals remain to be satisfied.

3. The method of claim 1, wherein said repeating step is repeated until all said test goals have been satisfied.

4. A method for preparing in-circuit test vectors for an electrical component, comprising:

establishing test goals for each pin of said electrical component;

automatically generating a trial block of at least one test vector;

applying each test vector of said trial block to said pins of said electrical component;

after application of each test vector of said trial block, testing whether any of said test goals have been satisfied; and if so, saving said trial block as a learned block of test vectors, if not, automatically generating an additional test vector, adding said additional test vector to said trial block, applying said additional test vector to said pins of said electrical component, and repeating said testing step.

5. The method of claim 4, said automatically generating steps each comprising:

generating a pseudorandom number; and creating said test vector as a function of said pseudorandom number.

6. The method of claim 4, further comprising, minimizing a number of test vectors in said trial block by eliminating test vectors that are unnecessary for the satisfaction of test goals.

7. The method of claim 6, said minimizing step comprising:

selecting a subset of test vectors from said trial block;

applying said subset of test vectors to said pins of said electrical component;

after application of said subset of test vectors, testing whether any of said test goals have been satisfied; and if so, replacing said trial block with said subset of test vectors, and repeating said selecting, applying and testing steps, if not, selecting a second subset of test vectors from said trial block greater in number than said first subset, and repeating said applying and testing steps.

8. The method of claim 6, said minimizing step comprising:

defining a vector mask having a length in vectors less than a number of vectors in said trial block;

masking said trial block with said mask;

applying unmasked test vectors from said trial block to said electrical component;

after application of said unmasked test vectors, testing whether any of said test goals are satisfied; and if so, redefining said trial block as said unmasked test vectors, and repeating said defining, masking, applying and testing steps, if not, reducing said length of said mask, and repeating said masking, applying and testing steps.

9. The method of claim 8, further comprising, stopping said minimizing step when said mask reaches a predetermined minimum length.

10. The method of claim 4, further comprising, verifying completeness of said trial block, before saving said trial block as said learned block by confirming an ability of said trial block to initialize said electrical component after varying periods of applying and removing power to said electrical component.

11. The method of claim 10, said verifying step comprising:

removing power from said electrical component;

waiting a first time interval;

reapplying power to said electrical component;

waiting a second time interval;

applying each test vector of said trial block to said pins of said electrical component;

determining whether any of said test goals are unsatisfied;

changing said first and second time intervals; and repeating the above steps.

12. The method of claim 4, further comprising verifying a stability of said trial block before saving said trial block as said learned block.

13. The method of claim 12, said verifying step comprising:

generating a plurality of stability checking vectors;

conducting a stability checking procedure, comprising:

applying said plurality of stability checking vectors to said pins of said electrical component;

applying said test vectors of said trial block to said pins of said electrical component;

testing whether any goals are unsatisfied;

generating a plurality of new stability checking vectors; and repeating said stability checking procedure.

14. An apparatus for automatically generating in-circuit test vectors for an electrical component having accessible electrical nodes, comprising:

at least one controllable channel circuit, connectable to accessible nodes of an electrical component for which in-circuit vectors are to be generated, each channel circuit being capable of asserting and detecting desired logic levels on said nodes of said electrical component;

a programmed computer, comprising:

a test vector generator for generating a plurality of test vectors for application to said nodes through said at least one channel circuit;

a test portion for determining whether or not application of said plurality of test vectors satisfies any predetermined test goals for said nodes of said electrical components; and a memory, responsive to an indication that a subset of said plurality of test vectors satisfies at least one of said test goals, for storing said subset of test vectors for use as a portion of an in-circuit test for said electrical component.

15. The apparatus of claim 13, each channel circuit including a high impedance state detecting circuit, comprising:

a resistor connectable between a high impedance detection voltage source and a node of said electrical component under test; and a comparator circuit for comparing a voltage appearing on said node with at least one threshold to determine whether said node is in a high impedance state.

16. The apparatus of claim 15, said comparator circuit comprising:

a first comparator for comparing said voltage appearing on said node with a first threshold; and a second comparator for comparing said voltage appearing on said node with a second threshold, greater than said first threshold;

wherein a high impedance state is detected when said voltage appearing on said node is greater than said first threshold and less than said second threshold.

* * * * *

UNITED STATES PATENT AND TRADEMARK OFFICE
CERTIFICATE OF CORRECTION

PATENT NO. : 5,596,587

DATED : January 21, 1997

INVENTOR(S) : Douglas W. Raymond, Philip J. Stringer, Harold W. Ng and Terence N. Lee It is certified that error appears in the above-identified patent and that said Letters Patent is hereby corrected as shown below:

On title page, in [75] delete "Raymond W. Douglas" and replace --Douglas W. Raymond-- therefor.

On title page, in [75] delete "Stinger" and replace --Stringer-- therefor.

On title page, in [19] "Douglas" should read --Raymond--

Signed and Sealed this

Sixth Day of May, 1997

Attest:

BRUCE LEHMAN

Attesting Officer

Commissioner of Patents and Trademarks